US007476937B2

(12) United States Patent
Kawasaki et al.

(10) Patent No.: US 7,476,937 B2
(45) Date of Patent: Jan. 13, 2009

(54) SEMICONDUCTOR DEVICE AND METHOD OF FABRICATING THE SAME

(75) Inventors: Ritsuko Kawasaki, Machida (JP); Kenji Kasahara, Tsukuba (JP); Hisashi Ohtani, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/625,904

(22) Filed: Jul. 24, 2003

(65) Prior Publication Data

US 2004/0140470 A1 Jul. 22, 2004

Related U.S. Application Data

(62) Division of application No. 09/640,077, filed on Aug. 17, 2000, now Pat. No. 6,599,788.

(30) Foreign Application Priority Data

Aug. 18, 1999 (JP) ................................ 11-231281

(51) Int. Cl.
*H01L 29/04* (2006.01)

(52) U.S. Cl. ......................... 257/347; 257/72; 257/353; 257/E29.151; 257/E29.275; 257/E29.279; 257/E21.293; 438/149

(58) Field of Classification Search .................. 257/72, 257/347–354, 59; 438/151, 149
See application file for complete search history.

(56) References Cited

U.S. PATENT DOCUMENTS

| | | | | |
|---|---|---|---|---|
| 4,998,152 | A * | 3/1991 | Batey et al. | 257/57 |
| 5,643,826 | A | 7/1997 | Ohtani et al. | |

(Continued)

FOREIGN PATENT DOCUMENTS

| | | | |
|---|---|---|---|
| JP | 07-130652 | | 5/1995 |
| JP | 8-50304 | * | 2/1996 |
| JP | 11-4001 | * | 1/1999 |
| JP | 2000-31493 | * | 1/2000 |
| JP | 2001-203360 | | 7/2001 |

OTHER PUBLICATIONS

K. Shimizu et al., "High-Mobility Poly-Si Thin-Film Transistors Fabricated by a Novel Excimer Laser Crystallization Method," IEEE Transactions on Electron Devices, vol. 40, No. 1, pp. 112-117, 1993.F (Continued)

*Primary Examiner*—Ahmed Sefer
(74) *Attorney, Agent, or Firm*—Eric J. Robinson; Robinson Intellectual Property Law Office, P.C.

(57) ABSTRACT

A crystalline semiconductor film in which the position and size of a crystal grain is controlled is fabricated, and the crystalline semiconductor film is used for a channel formation region of a TFT, so that a high performance TFT is realized. An island-like semiconductor layer is made to have a temperature distribution, and a region where temperature change is gentle is provided to control the nucleus generation speed and nucleus generation density, so that the crystal grain is enlarged. In a region where an island-like semiconductor layer 1003 overlaps with a base film 1002, a thick portion is formed in the base film 1002. The volume of this portion increases and heat capacity becomes large, so that a cycle of temperature change by irradiation of a pulse laser beam to the island-like semiconductor layer becomes gentle (as compared with other thin portion). Like this, a laser beam is irradiated from the front side and reverse side of the substrate to directly heat the semiconductor layer, and heat conduction from the semiconductor layer to the side of the substrate and heat conduction of the semiconductor layer in the horizontal direction to the substrate are used, so that the increase in the size of the crystal grain is realized.

16 Claims, 23 Drawing Sheets

U.S. PATENT DOCUMENTS

| | | | | |
|---|---|---|---|---|
| 5,728,259 | A * | 3/1998 | Suzawa et al. | 438/164 |
| 5,763,904 | A * | 6/1998 | Nakajima et al. | 257/66 |
| 5,811,322 | A | 9/1998 | Robinson | |
| 5,841,197 | A | 11/1998 | Adamic, Jr. | |
| 5,893,730 | A | 4/1999 | Yamazaki et al. | |
| 5,923,962 | A | 7/1999 | Ohtani et al. | |
| 5,965,916 | A * | 10/1999 | Chen | 257/347 |
| 6,043,512 | A * | 3/2000 | Adachi | 257/66 |
| 6,078,070 | A | 6/2000 | Robinson | |
| 6,107,107 | A | 8/2000 | Bruce et al. | |
| 6,160,270 | A * | 12/2000 | Holmberg et al. | 257/59 |
| 6,191,476 | B1 * | 2/2001 | Takahashi et al. | 257/706 |
| 6,218,219 | B1 * | 4/2001 | Yamazaki et al. | 438/149 |
| 6,245,602 | B1 * | 6/2001 | Ho et al. | 438/158 |
| 6,258,723 | B1 * | 7/2001 | Takeichi et al. | 438/706 |
| 6,285,042 | B1 | 9/2001 | Ohtani et al. | |
| 6,335,541 | B1 | 1/2002 | Ohtani et al. | |
| 6,346,438 | B1 | 2/2002 | Yagishita et al. | |
| 6,410,368 | B1 | 6/2002 | Kawasaki et al. | |
| 6,492,659 | B1 | 12/2002 | Yamazaki et al. | |
| 6,501,094 | B1 * | 12/2002 | Yamazaki et al. | 257/57 |
| 6,555,875 | B2 | 4/2003 | Kawasaki et al. | |
| 6,653,657 | B2 | 11/2003 | Kawasaki et al. | |
| 6,762,081 | B2 | 7/2004 | Yamazaki et al. | |
| 7,078,321 | B2 | 7/2006 | Yoshimoto | |
| 7,122,409 | B2 | 10/2006 | Kawasaki et al. | |
| 7,247,882 | B2 * | 7/2007 | Yamazaki et al. | 257/72 |
| 2003/0092213 | A1 * | 5/2003 | Yamazaki et al. | 438/48 |

OTHER PUBLICATIONS

Ishihara et al., "Location-Controlled Adjacent Grains Following Excimer-Laser Melting of Si Thin-Films," 1998, pp. 153-156, AM-LCD.

Specifications and Drawings for U.S. Appl. No. 09/696,165, "Semiconductor Device and Method of Manufacturing the Same," filed on Oct. 26, 2000, pp. 1-63, 33 pages of drawings, Inventors: Ritsuko Kawasaki, et al.

Specifications and Drawings for U.S. Appl. No. 09/598,827, "Method of Fabricating a Semiconductor Device," filed on Jun. 21, 2000, pp. 1-64, 25 pages of drawings, Inventor: Kenji Kasahara.

Specifications and Drawings for U.S. Appl. No. 09/732,724, "Semiconductor Device and A Method of Manufacturing the Same," filed on Dec. 11, 2000, pp. 1-50, 26 pages of drawings, Inventors: Ritsuko Kawasaki et al.

Ishihara et al., "Location Control of Large Grain Following Excimer-Laser Melting of Si Thin-Films," Mar. 1998, pp. 1071-1075, Japanese Journal of Applied Physics, vol. 37, Pt. 1, No. 3B.

* cited by examiner

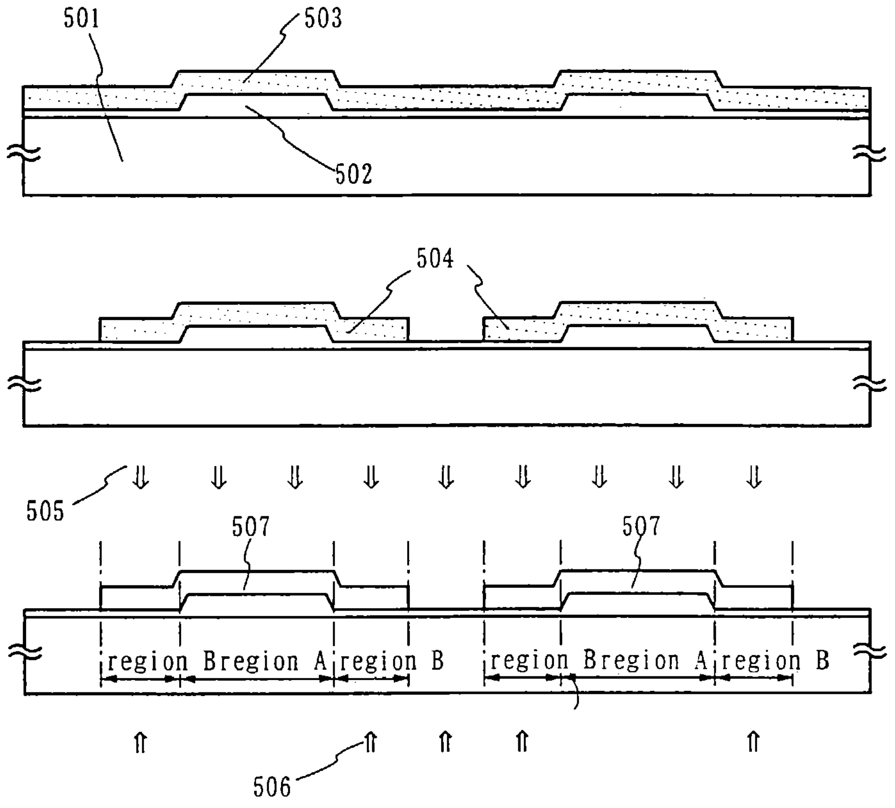
FIG. 5A
FIG. 5B
FIG. 5C
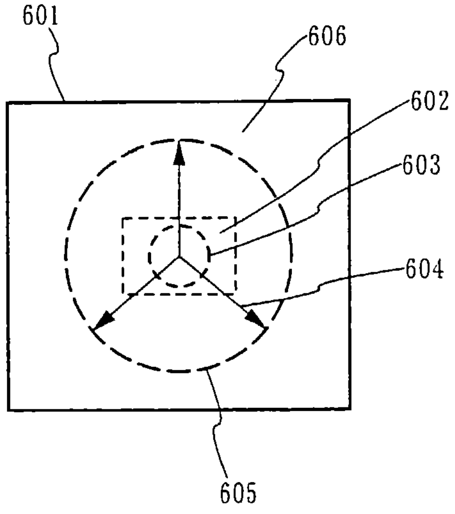
FIG. 6

510
512
513
511

514

515

516
518
518
region B
region A
region B
region B
region A
region B

517

SEMICONDUCTOR DEVICE AND METHOD OF FABRICATING THE SAME

This application is a Division of application Ser. No. 09/640,077 filed Aug. 17, 2,000 now U.S. Pat. No. 6,599,788.

BACKGROUND OF THE INVENTION

1. Field of the Invention

The present invention relates to a method of fabricating a semiconductor film having a crystal structure and formed on a substrate having an insulating surface, and a method of fabricating a semiconductor device using the semiconductor film as an active layer. Particularly, the present invention relates to a method of fabricating a thin film transistor in which an active layer is formed of a crystalline semiconductor layer. Incidentally, in the present specification, the term "semiconductor device" indicates all devices capable of functioning by using semiconductor characteristics, and includes, in its category, an electro-optical device typified by an active matrix type liquid crystal display device formed by using thin film transistors, and an electronic equipment incorporating that kind of electro-optical device as a part.

2. Description of the Related Art

There has been developed a thin film transistor (hereinafter referred to as a TFT) in which an amorphous semiconductor layer is formed on a translucent substrate having an insulating surface and a crystalline semiconductor layer crystallized by a laser annealing method, heat annealing method or the like is made an active layer. As the insulating substrate, a glass substrate of barium borosilicate glass or alumino borosilicate glass is often used. Although such a glass substrate is inferior to a quartz substrate in heat resistance, it has merits that its market price is inexpensive and a large area substrate can be easily manufactured.

The laser annealing method is known as a crystallizing technique in which it is possible to crystallize an amorphous semiconductor layer by giving high energy to only the amorphous semiconductor layer without raising the temperature of a glass substrate very much. Particularly an excimer laser capable of obtaining short wavelength light having a wavelength of 400 nm or less and large output is regarded as most suitable in this usage. The laser annealing method using the excimer laser is carried out in such a manner that a laser beam is processed by an optical system into a spot shape or linear shape on a surface to be irradiated, and the surface to be irradiated on the substrate is scanned by the processed laser beam (irradiation position of the laser beam is moved relatively to the surface to be irradiated). For example, in an excimer laser annealing method using a linear laser beam, it is also possible to make laser annealing of all the surfaces to be irradiated by scanning only in the direction normal to its longitudinal direction, and is superior in productivity, so that it has become the mainstream of a manufacturing technique of a liquid crystal display device using TFTs. The technique enables a monolithic type liquid crystal display device in which TFTs (pixel TFTs) for forming a pixel portion and TFTs of a driving circuit provided at the periphery of the pixel portion are formed on one glass substrate.

However, a crystalline semiconductor layer fabricated by the laser annealing method is formed of an aggregation of plural crystal grains, and the positions and sizes of the crystal grains are random. TFTs fabricated on the glass substrate are formed such that the crystalline semiconductor layer is separated into an island-like pattern for the purpose of element separation. In that case, it was impossible to specify the positions and sizes of the crystal grains and form them. In the interface (crystal grain boundary) of the crystal grain, there is a cause to lower current transport characteristics of carriers because of a recombination center or trapping center due to an amorphous structure, crystal defect or the like, or the influence of a potential level at the crystal grain boundary. However, it has been hardly possible to form a channel formation region, in which the property of a crystal greatly influences the characteristics of a TFT, by a single crystal grain so as to exclude the influence of the crystal grain boundary. Thus, a TFT including an active layer of a crystalline silicon film and having characteristics comparable to those of a MOS transistor has not been obtained till today.

In order to solve such problems, an attempt to grow a large crystal grain has been made. For example, in ["High-Mobility Poly-Si Thin-Film Transistors Fabricated by a Novel Excimer Laser Crystallization Method", K. Shimizu, O. Sugiura, and M. Matsumura, IEEE Transactions on Electron Devices vol. 40. No. 1, pp 112-117, 1993], there is a report on a laser annealing method in which a film of three-layer structure of $Si/SiO_2/Si$ is formed on a substrate, and an excimer laser beam is irradiated from both sides of a film side and a substrate side. This report discloses that according to this method, the size of a crystal grain can be enlarged by irradiation of a laser beam at predetermined energy intensity.

The above-mentioned method of Ishihara et al. is characterized in that heat characteristics of an under material of an amorphous silicon film are locally changed and the flow of heat to the substrate is controlled, so that a temperature gradient is caused. However, for that purpose, the three-layer structure of high melting point metal layer/silicon oxide layer/semiconductor film is formed on the glass substrate. Although it is possible to form a top gate type TFT by using the semiconductor film as an active layer in view of structure, since a parasitic capacitance is generated by the silicon oxide film provided between the semiconductor film and the high melting point metal layer, power consumption is increased and it becomes difficult to realize high speed operation of the TFT.

On the other hand, when the high melting point metal layer is made a gate electrode, it is conceivable that the method can be effectively applied to a bottom gate type or reverse stagger type TFT. However, in the foregoing three-layer structure, even if the thickness of the semiconductor film is omitted, with respect to the thickness of the high melting point metal layer and the silicon oxide layer, since the thickness suitable for a crystallizing step is not necessarily coincident with the thickness suitable for the characteristics as a TFT element, it is impossible to simultaneously satisfy both the optimum design in the crystallizing step and the optimum design in the element structure.

Besides, when the opaque high melting point metal layer is formed on the entire surface of the glass substrate, it is impossible to fabricate a transmission type liquid crystal display device. Although the high melting point metal layer is useful in that its thermal conductivity is high, since a chromium (Cr) film or titanium (Ti) film used as the high melting point metal material layer has high internal stress, there is a high possibility that a problem as to adhesiveness to the glass substrate occurs. Further, the influence of the internal stress is also exerted on the semiconductor film formed as the upper layer, and there is a high possibility that the stress functions as force to impart distortion to the formed crystalline semiconductor film.

On the other hand, in order to control a threshold voltage (hereinafter referred to as Vth) as an important characteristic parameter in a TFT within a predetermined range, in addition to valence electron control of the channel formation region, it is necessary to reduce the charged defect density of a base film and a gate insulating film formed of an insulating film to be in close contact with the active layer, or to consider the balance of the internal stress. To such requests, a material containing silicon as its constituent element, such as a silicon oxide film or a silicon nitride oxide film, has been suitable. Thus, there is a fear that the balance is lost by providing the high melting point metal layer to cause the temperature gradient.

SUMMARY OF THE INVENTION

The present invention has been made to solve such problems, and an object of the invention is to realize a TFT capable of operating at high speed by fabricating a crystalline semiconductor film in which the positions and sizes of crystal grains is controlled and further by using the crystalline semiconductor film for a channel formation region of the TFT. Further, another object of the invention is to provide a technique enabling such a TFT to be applied to various semiconductor devices such as a transmission type liquid crystal display device or a display device using organic electroluminecence material.

A laser annealing method is used as a method of forming a crystalline semiconductor layer from an amorphous semiconductor layer formed on a substrate of glass or the like. In the laser annealing method of this invention, a pulse oscillation or continuous-wave excimer laser or argon laser is used as a light source, and a laser beam formed into a linear shape by an optical system is irradiated to an island-like semiconductor layer from both sides of a front side of a substrate where the island-like semiconductor layer is formed (in this specification, the front side is defined as a surface where an island-like semiconductor layer is formed) and a reverse side (in this specification, it is defined as a surface opposite to the surface where the island-like semiconductor layer is formed).

FIG. 2A is a view showing a structure of a laser annealing apparatus of the present invention. The laser annealing apparatus includes a laser oscillator 1201, an optical system 1100, and a stage 1202 for fixing a substrate. The stage 1202 is provided with a heater 1203 and a heater controller 1204, and can heat the substrate up to 100 to 450° C. A reflecting plate 1205 is provided on the stage 1202, and a substrate 1206 is set thereon. In the structure of the laser annealing apparatus of FIG. 2A, a method of holding the substrate 1206 will be described with reference to FIG. 2B. The substrate 1206 held at the stage 1202 is set in a reaction chamber 1213, and is irradiated with a laser beam. The inside of the reaction chamber can be made a low pressure state or inert gas atmosphere by a not-shown exhaust system or gas system, and a semiconductor film can be heated up to 100 to 450° C. without pollution. The stage 1202 can be moved along a guide rail 1216 in the reaction chamber, and the entire surface of the substrate can be irradiated with the linear laser beam. The laser beam is incident from a not-shown quartz window provided above the substrate 1206. Besides, in FIG. 2B, a transfer chamber 1210, an intermediate chamber 1211, and a load/unload chamber 1212 are connected to the reaction chamber 1213, and they are separated by partition valves 1217 and 1218. A cassette 1214 capable of holding a plurality of substrates is set in the load/unload chamber 1212, and the substrate is conveyed by a conveying robot 1215 provided in the transfer chamber 1210. A substrate 1206' indicates a substrate under conveyance. By adopting such structure, it is possible to continuously carry out laser annealing under the low pressure or in the inert gas atmosphere.

FIGS. 3A and 3B are views for explaining the structure of the optical system 1100 of the laser annealing apparatus shown in FIG. 2A. An excimer laser, argon laser or the like is used as a laser oscillator 1101. FIG. 3A is a view of the optical system 1100 seen from the side, and a laser beam emitted from the laser oscillator 1101 is divided in the vertical direction by a cylindrical lens array 1102. After the divided laser beam is once condensed by a cylindrical lens 1104, it broadens, is reflected by a mirror 1107, and then, is made a linear laser beam on an irradiation surface 1109 by a cylindrical lens 1108. By this, the energy distribution of the linear laser beam in a width direction can be uniformed. FIG. 3B is a view of the optical system 1100 seen from above, and the laser beam emitted from the laser oscillator 1101 is divided in the horizontal direction by the cylindrical lens array 1102. Thereafter, the laser beams are synthesized into one beam on the irradiation surface 1109 by the cylindrical lens 1105. By this, the energy distribution of the linear laser beam in the longitudinal direction can be uniformed.

FIG. 1 is a view for explaining the concept of a laser annealing method of the present invention. An insulating film 1002 is formed on a substrate 1001 of glass or the like, and an island-like semiconductor layer 1003 is formed thereon. A silicon oxide film, a silicon nitride film, a silicon nitride oxide film, an insulating film containing aluminum as its main ingredient, or the like is applied to the insulating film 1002, and a single film among these or a suitable combination of these is used. By the optical system explained in FIGS. 3A and 3B, the laser beam having passed through the cylindrical lens 1005 with the function equivalent to the cylindrical lens 1108 is irradiated as the linear laser beam to the island-like semiconductor layer 1003. The island-like semiconductor layer 1003 receives a first laser beam component 1006 which passes through the cylindrical lens 1005 and is directly irradiated to the island-like semiconductor layer 1003 and a second laser beam component 1007 which passes through the insulating film 1002 and the substrate 1001, is reflected by a reflecting plate 1004, again passes through the substrate 1001 and the insulating film 1002, and is irradiated to the island-like semiconductor layer 1003. In any case, since the laser beam having passed through the cylindrical lens 1005 has an incident angle of 45 to 90° with respect to the surface of the substrate in the condensing process, the laser beam reflected by the reflecting plate 1004 is also reflected toward the inside of the island-like semiconductor layer 1003. In the reflecting plate 1004, a reflecting surface is formed of aluminum (Al), titanium (Ti), titanium nitride (TiN), chromium (Cr), tungsten (W), tungsten nitride (WN), or the like. Like this, by suitably selecting the material forming the reflecting surface, the reflectivity can be changed in the range of 20 to 90%, and the intensity of the laser beam incident from the reverse side of the substrate 1001 can be changed. If the reflection surface is made a mirror surface, positive reflectivity of about 90% can be obtained within the wavelength range of 240 to 320 nm. Besides, if the material is made aluminum and minute uneven shapes of several hundred nm are formed on the surface, diffusion reflectivity (integral reflectivity—positive reflectivity) of 50 to 70% is obtained.

In this way, the laser beam is irradiated from the front surface and the reverse surface of the substrate 1001, and the island-like semiconductor layer formed on this substrate 1001 is laser annealed from both surfaces. In the laser annealing method, by optimizing the condition of an irradiated laser beam, a semiconductor film is instantaneously heated and melted, and the generation density of crystal nuclei and crystal growth from the crystal nuclei is controlled. Since the oscillation pulse width of an excimer laser is several nano seconds to several tens nano seconds, for example, 30 nano seconds, if irradiation is made under a pulse oscillation frequency of 30 Hz, the semiconductor layer of the region which is irradiated with the laser beam is instantaneously heated by the pulse laser beam, and is cooled for a time far longer than the heating time.

If the laser beam is irradiated to the island-like semiconductor layer formed on the substrate from only one surface, only one side is heated, so that a cycle of heating melting and cooling solidification becomes steep. Thus, even if the generation density of crystal nuclei can be controlled, satisfactory crystal growth can not be expected. However, if the laser beam is irradiated from both surfaces of the semiconductor layer, the cycle of heating melting and cooling solidification becomes gentle, and a time allowed for crystal growth in the process of cooling solidification becomes relatively long, so that satisfactory crystal growth can be obtained.

In the transient phenomenon, an attempt is made such that the island-like semiconductor layer is made to have a temperature distribution, a region where temperature change is gentle is formed, and a nucleus generation speed and nucleus generation density are controlled, so that the size of the crystal grain is enlarged. Specifically, as shown in FIG. 1, in the region where the island-like semiconductor layer 1003 overlaps with the base film 1002, a thick portion is formed in the base film 1002. At this portion, since its volume is increased and heat capacity is increased, the cycle of temperature change of the island-like semiconductor layer by the irradiation of the pulse laser beam becomes gentle (as compared with the other thin portion). In the present invention, like this, the laser beam is irradiated from the front surface side and the reverse surface side of the substrate to directly heat the semiconductor layer, and at the same time, heat conduction control from the semiconductor layer to the substrate side and heat conduction (due to a temperature gradient) of the semiconductor layer in the horizontal direction to the substrate are used, so that enlargement of the size of the crystal grain is realized.

In addition, with respect to the method of irradiating the laser beam from the front surface side and the reverse surface side of the substrate on which the island-like semiconductor layer is formed, a structure shown in FIG. 4 may be used. A light beam emitted from a laser oscillator 401 such as an excimer laser is divided by a cylindrical lens array 402 (or 403). After this divided laser beam is once condensed by a cylindrical lens 404 (or 405), it broadens and is reflected by a mirror 408. A beam splitter 406 is put on the midway of this optical path to divide the optical path in two. One laser beam is reflected by mirrors 407 and 413, is made a linear laser beam by a cylindrical lens 414, and is irradiated to the front side of a substrate 418. This laser beam is made a first laser beam. A base film 419 and an island-like semiconductor layer 420 are formed on the front side of the substrate 418. The other laser beam is reflected by mirrors 408, 409 and 411, is made a linear laser beam by a cylindrical lens 412, and is irradiated to the reverse side of the substrate 418. This laser beam is made a second laser beam. In the midway of this optical path, an attenuator is provided to adjust the intensity of the laser beam. In this structure, even when the laser beam is irradiated from the front side and the reverse side of the substrate, the size of the crystal grain of the semiconductor layer can be enlarged similarly to the foregoing.

In this invention, such a laser annealing method is called a dual beam laser annealing method, and this method is used to enlarge the size of a crystal grain of an island-like semiconductor layer. Such an island-like semiconductor layer is used for an active layer of a TFT, and further, a semiconductor device including a TFT having a structure in accordance with the function of each circuit is fabricated, so that the performance of the semiconductor device is improved.

The structure of the present invention using such a dual beam laser annealing method is characterized in that a base film having a region of a first thickness and a region of a second thickness smaller than the first thickness are formed on one surface of a translucent substrate, the region of the first thickness has an area smaller than the region of the second thickness, and an island-like semiconductor layer having a crystal structure on the base film is formed over the region of the first thickness and the region of the second thickness.

Another structure of the invention is characterized in that a heat conduction layer formed like an island is provided on one surface of a translucent substrate, a base film on the translucent substrate is formed to cover the heat conduction layer, and at least a part of an island-like semiconductor layer having a crystal structure on the base film is formed on the heat conduction layer.

Besides, another structure of the present invention is characterized by including a step of forming a base film of a first thickness on one surface of a translucent substrate, a step of forming a region of the first thickness and a region of a second thickness smaller than the first thickness by etching a part of the base film, a step of forming an island-like semiconductor layer on the base film and over the region of the first thickness and the region of the second thickness, and a step of crystallizing the island-like semiconductor layer by irradiating a laser beam to the island-like semiconductor layer from one surface side and the other surface side of the translucent substrate.

Besides, another structure of the present invention is characterized by including a step of forming an island-like heat conduction layer on one surface of a translucent substrate, a step of forming a base film of a first thickness on the translucent substrate to cover the island-like heat conduction layer, a step of forming an island-like semiconductor layer which is formed on the base film, which has an area larger than the island-like heat conduction layer, and at least a part of which overlaps with the island-like heat conduction layer, and a step of crystallizing the island-like semiconductor layer by irradiating a laser beam to the island-like semiconductor layer from one surface side of the translucent substrate and the other surface side.

Besides, another structure of the present invention is characterized by including a step of forming a base film of a first thickness on one surface of a translucent substrate, a step of forming a region of a first thickness and a region of a second thickness smaller than the first thickness by etching a part of the base film, a step of forming an island-like semiconductor layer on the base film and over the region of the first thickness and the region of the second thickness, and a step of crystallizing the island-like semiconductor layer by irradiating the laser beam from one surface side of the translucent substrate and by causing a reflecting plate provided at the other surface side of the translucent substrate to reflect a laser beam, which was incident on a peripheral region of the island-like semiconductor layer and passed through the translucent substrate, so that the laser beam is irradiated from the other surface side of the translucent substrate.

Besides, another structure of the present invention is characterized by including a step of forming an island-like heat conduction layer on one surface of a translucent substrate, a step of forming a base film of a first thickness on the translucent substrate to cover the island-like heat conduction layer, forming an island-like semiconductor layer which is formed on the base film, which has an area larger than the island-like heat conduction layer, and at least a part of which overlaps with the island-like heat conduction layer, and a step of crystallizing the island-like semiconductor layer by irradiating a laser beam from one surface side of the translucent substrate and by causing a reflecting plate provided at the other surface side of the translucent substrate to reflect a laser beam, which was incident on a peripheral region of the island-like semiconductor layer and passed through the translucent substrate, so that the laser beam is irradiated from the other surface side of the translucent substrate.

BRIEF DESCRIPTION OF THE DRAWINGS

In the accompanying drawings:

FIGS. 5A to 5C are views for explaining a fabricating process of an island-like semiconductor layer of the present invention;

FIG. 6 is a view for explaining the concept of crystallization of the present invention.

DETAILED DESCRIPTION OF THE PREFERRED EMBODIMENTS

Embodiment 1

Figure 1:
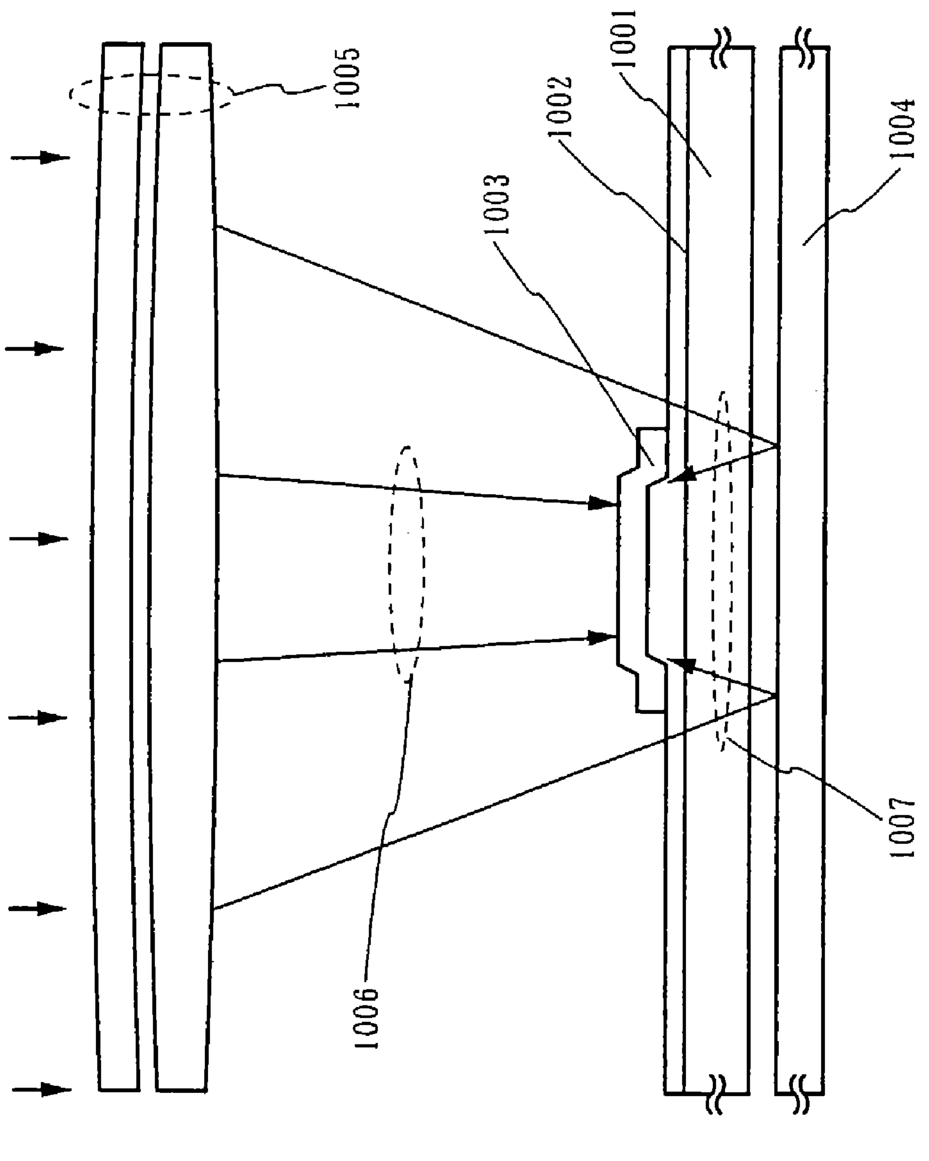
FIG. 1 is a view for explaining the concept of a laser annealing method of the present invention.

An embodiment of the present invention will be described with reference to FIGS. 5A to 5C. In FIG. 5A, an alkali-free glass substrate of barium borosilicate glass, alumino borosilicate glass, or the like is used as a substrate 501. For example, #7059 glass or #1737 glass of Corning Inc. can be preferably used. In addition, a plastic substrate having no optical anisotropy, such as polyethylene terephthalate (PET), polyethylene naphthalate (PEN), or polyethersulfone (PES), can also be used. On a surface of the substrate 501 on which an island-like semiconductor layer is formed, in order to prevent the diffusion of an impurity such as an alkaline metal element from the substrate 501, a base film 502 of a silicon oxide film, a silicon nitride film, or a silicon nitride oxide film is formed to a thickness of 100 to 300 nm. The base film 502 may be formed of one layer among these films, or may be formed by laminating the plurality of films. For example, a silicon nitride oxide film made from $SiH_4$, $NH_3$, and $N_2O$ is formed by a plasma CVD method.

In order to form a thick portion and a thin portion in this base film 502, a resist mask is formed by a photolithography technique, and an etching process is performed. As the etching, a wet etching using a solution containing hydrofluoric acid, a dry etching using $CF_4$, or the like can be applied. In any event, etching of a portion of a thickness of 30 to 100 nm is performed to partially change the thickness of the base film 502. FIG. 5A schematically shows the shape.

Next, an amorphous semiconductor layer 503 having a thickness of 25 to 200 nm (preferably 30 to 100 nm) and an amorphous structure is formed by a well-known method such as a plasma CVD method or a sputtering method. For example, the amorphous silicon film having a thickness of 55 nm is formed by the plasma CVD method. A semiconductor film having an amorphous structure includes an amorphous semiconductor layer and a microcrystalline semiconductor film, and a compound semiconductor film having an amorphous structure, such as an amorphous silicon germanium film may be applied. Then, as shown in FIG. 5B, an island-like semiconductor layer 504 is formed from the amorphous semiconductor layer 503. The island-like semiconductor layer 504 can be made square, rectangular, or arbitrarily polygonal.

Figure 2A:
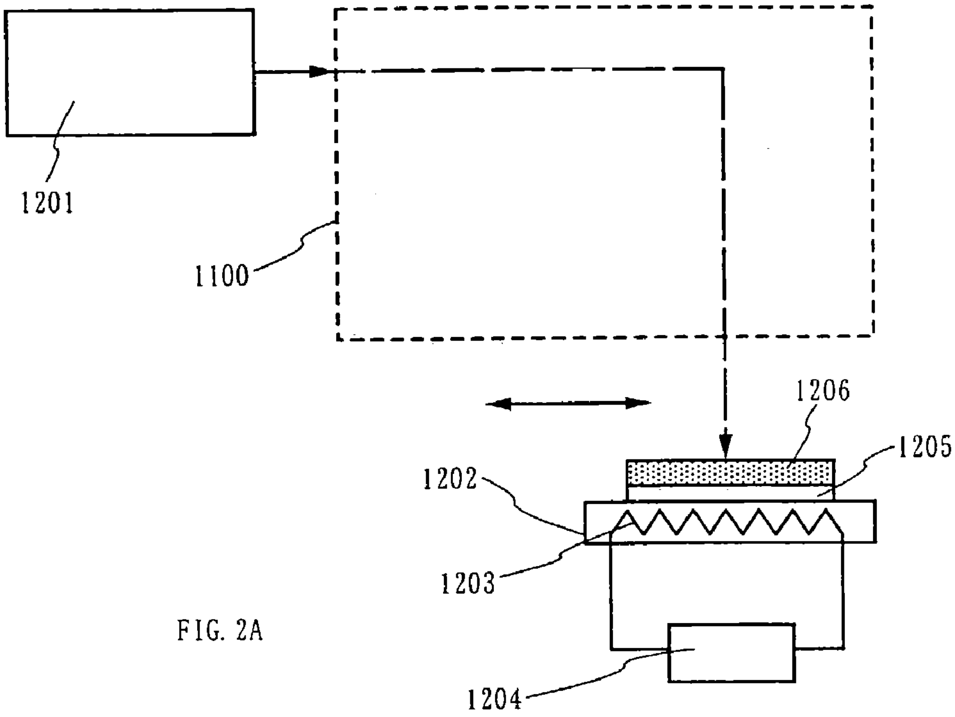
FIGS. 2A and 2B are views for explaining a structure of a laser annealing apparatus.
Figure 2B:
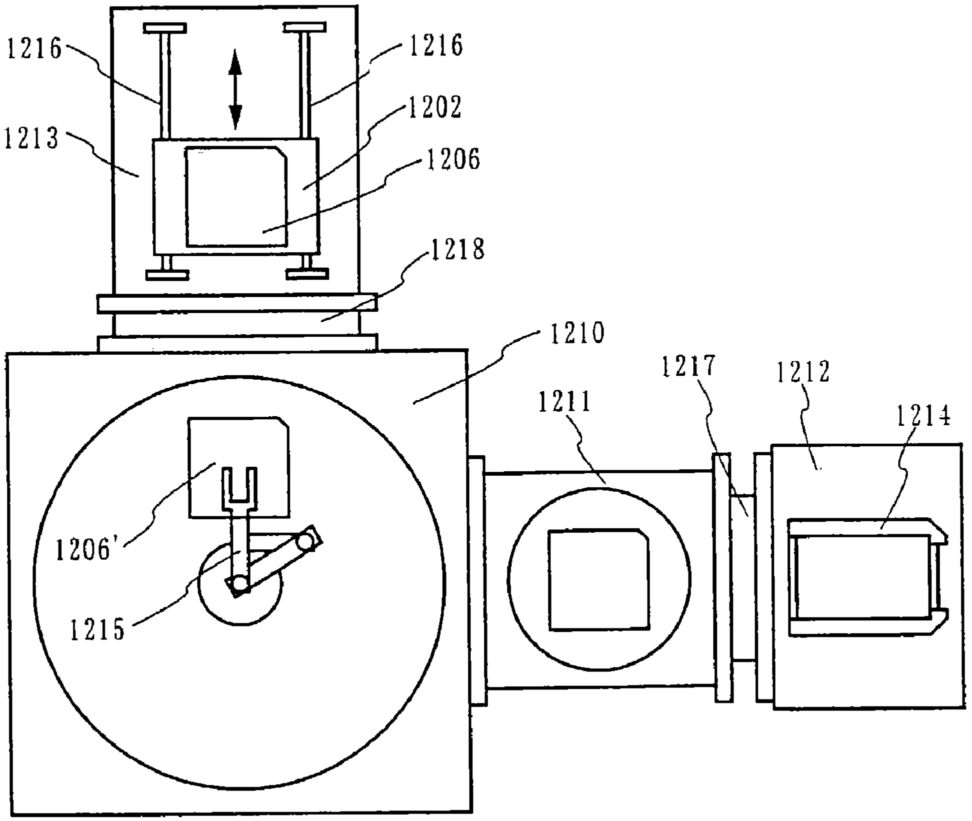
Figure 3A:
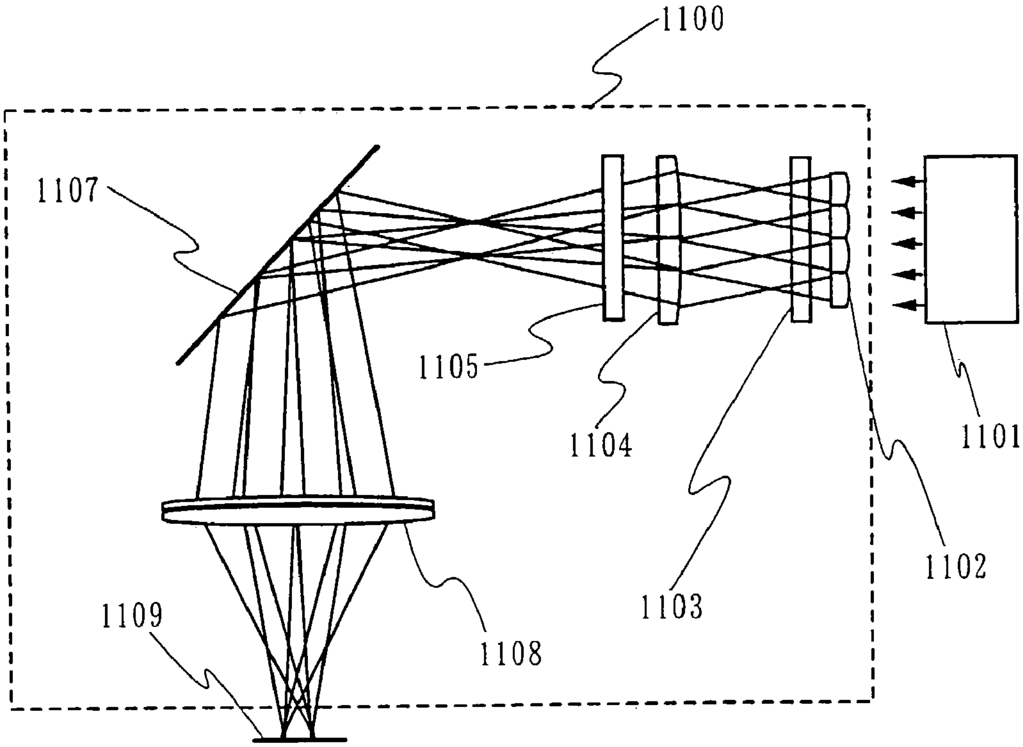
FIGS. 3A and 3B are views for explaining a structure of an optical system of the laser annealing apparatus.
Figure 3B:
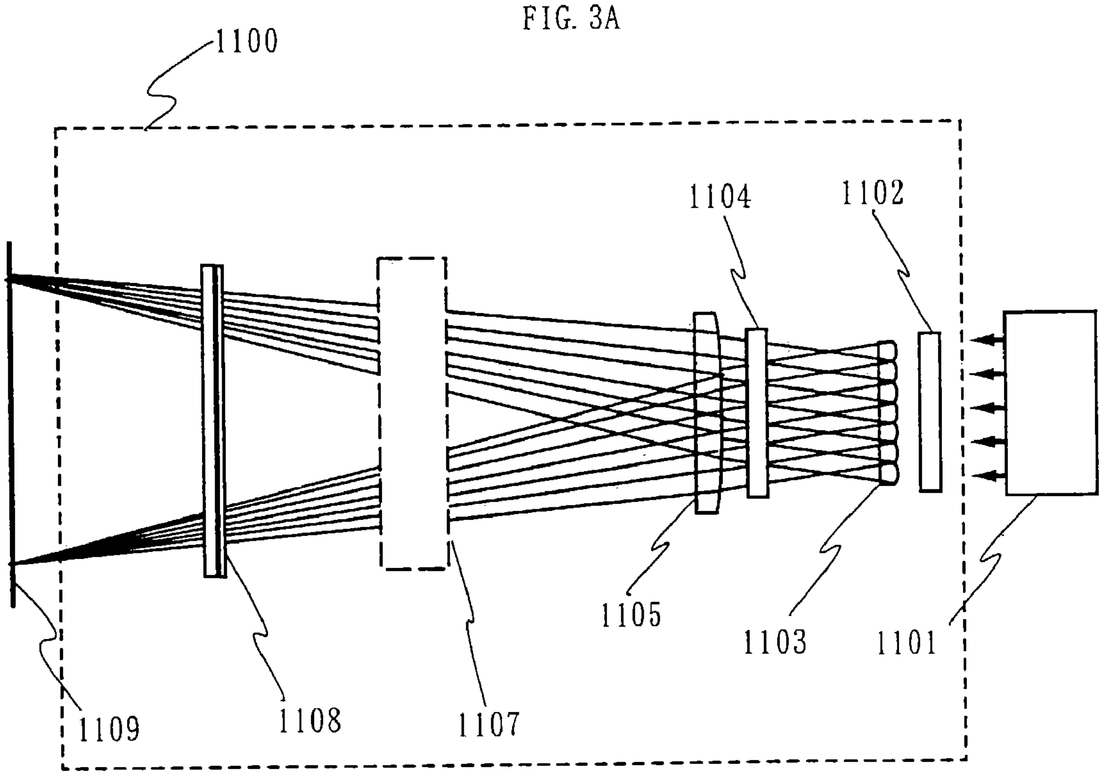
Figure 4:
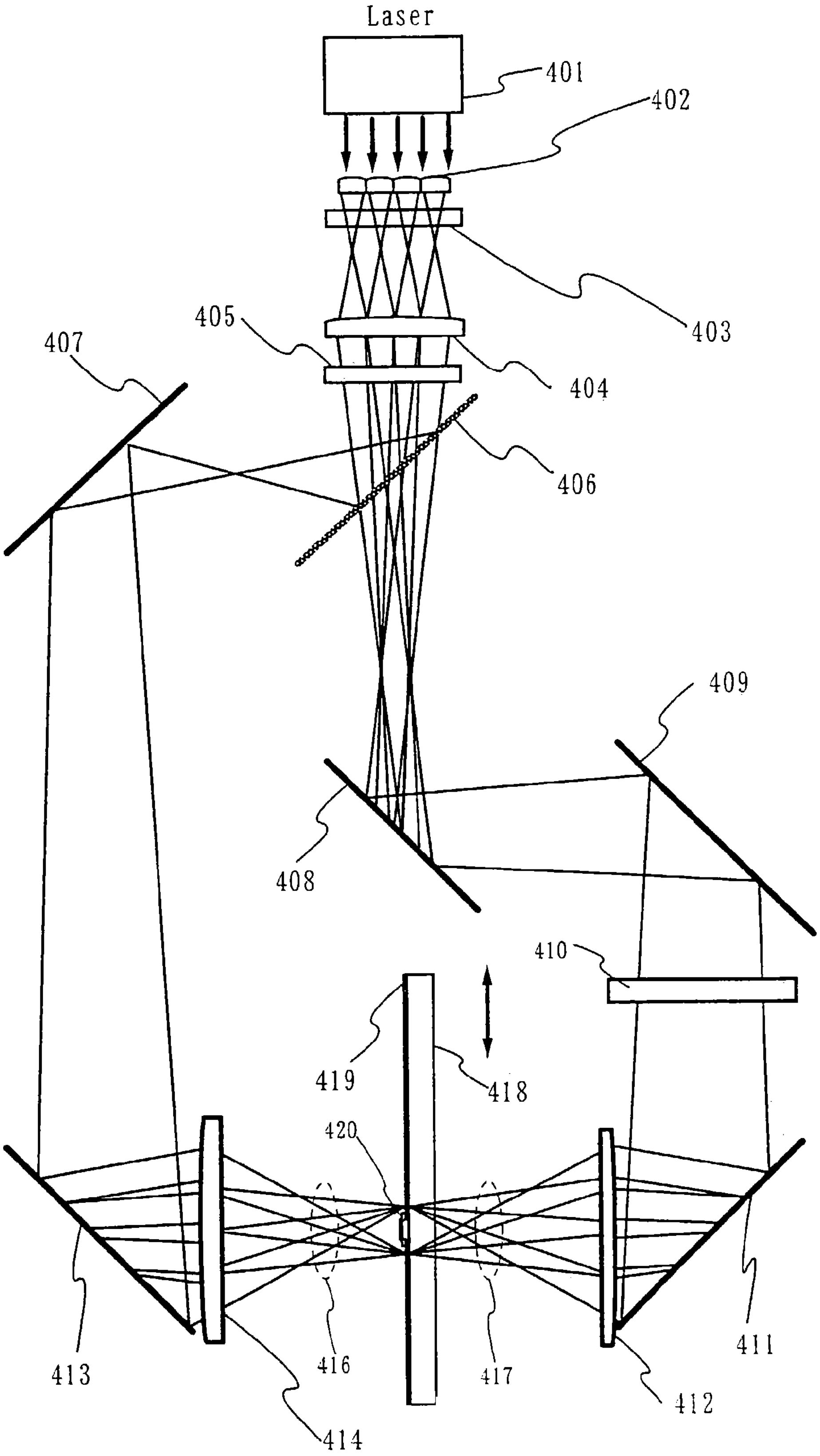
FIG. 4 is a view for explaining a structure of an optical system of a laser annealing apparatus.

Next, as shown in FIG. 5C, crystallization is performed by the dual beam laser annealing method. The structure and concept of its apparatus is applied similarly to that explained in FIGS. 2 to 4 as described above. For crystallization, first, it is desirable that hydrogen contained in the amorphous semiconductor layer is eliminated in advance, and it is appropriate that a heat treatment at 400 to 500° C. for about 1 hour is carried out to make the hydrogen content 5 atomic % or less.

Although the laser annealing condition is suitably selected by a user, for example, a pulse oscillation frequency of an excimer laser is made 30 Hz, a laser energy density is made 100 to 500 $mJ/cm^2$ (typically 300 to 350 $mJ/cm^2$), and a linear beam 505 of a line width of 100 to 1000 μm, for example, a line width 400 μm is irradiated. This line width is made larger than the island-like semiconductor layer 504, so that it is possible to irradiate the entire surface of at least one island-like semiconductor layer 504 at a side opposite to a substrate side and the periphery of the island-like semiconductor layer 504 by the linear beam of one pulse. A part of light irradiated to the periphery of the island-like semiconductor layer 504 at an incident angle θ reaches a reflecting plate placed below the substrate, and a part of light reflected at a reflection angle θ' is irradiated to the surface of the island-like semiconductor layer 504 at the substrate side. By using such a linear beam, the same place is repeatedly irradiated. Alternatively, irradiation is made plural times while the linear beam is scanned. It is appropriate that an overlap ratio of the linear beams at this time is made 50 to 98%. Actually, it is appropriate that the number of irradiation pulses is made 10 to 40. The shape of the laser beam is not limited to the linear shape, but even if a plane shape is adopted, the same processing can be made.

In the laser annealing method like this, the light irradiated to the periphery of the island-like semiconductor layer 504 at the incident angle θ is attenuated by about 50% in the process of passing through the substrate 501. Even if the positive reflectivity of the reflecting plate is made 90%, it appears that the laser beam irradiated to the surface of the island-like semiconductor layer 504 at the substrate side is about 15 to 40% of the first laser beam. However, the island-like semiconductor layer 504 can be sufficiently heated even by the second laser beam of such intensity. As a result, it becomes possible to sufficiently accomplish crystal growth. Since the substrate can be heated up to 100 to 450° C. also by the heater 1203 provided in the stage 1202 shown in FIG. 2, an effect obtained by heating the island-like semiconductor layer can be obtained to some degree. However, heating of the semiconductor layer by the second laser beam has an effect greater than this temperature.

In order to make the second laser beam effectively incident on the center side of the island-like semiconductor layer 504, it is effective that the reflecting plate is made aluminum, minute uneven shapes of several hundred nm are formed on the surface, and diffusion reflectivity is made 50 to 70% in advance. This is because a diffusion angle of the laser beam becomes large by the surface of the minute uneven shapes.

FIG. 5C shows the state where the first laser beam 505 and the second laser beam 506 are irradiated to the island-like semiconductor layer. The island-like semiconductor layer can be divided into the thick region (region A) of the base film 502 and the thin region (region B) thereof. In any case, the island-like semiconductor layer is heated by irradiation of the laser beam and is put in melted state. Although it is presumed that a crystal nucleus is generated in a cooling process where the melted state is shifted to a solid phase state, the nucleus generation density correlates with the temperature and cooling speed of the melted state, and a tendency that the nucleus generation density becomes high when the melted state is rapidly cooled from high temperature has been obtained as empirical knowledge.

When a presumption is made on the basis of such knowledge, in the region B where the melted state is rapidly cooled, the generation density of crystal nuclei becomes higher than the region A, and the crystal nuclei are generated at random, so that many crystal grains are apt to be formed, and the size of a grain becomes small by the mutual operation of the crystal grains grown from the respective crystal nuclei. On the other hand, in the region A, since the heat capacity is relatively large as compared with the region B, the temperature also becomes low. As a result, heat diffusion in the horizontal direction to the substrate surface occurs from the region B to the region A, the temperature change in the region A becomes gentle, and crystal growth is sufficiently accomplished. At this time, by making the nucleus generation density of the region A low, the size of the crystal grain can be enlarged. From this, it is appropriate that the size of the region A is made about 2 to 6 μm. Besides, such an effect becomes remarkable when the number of repeated pulses of the irradiated pulse laser beam is increased.

As a result, as shown in FIG. 5C, in an island-like semiconductor layer 507 made of a crystalline semiconductor film, a large grain of 2 μm or more is obtained with respect to the crystal grain in the region A, and in the region B, a small crystal grain as compared with that is formed. FIG. 6 is a top view showing this state, and an island-like semiconductor layer 601 can be divided into a region A602 (inside of a square dotted line at the center portion) and a region B606 other than that. The crystal growth proceeds toward the end portion of the island-like semiconductor layer 601, with a nucleus generation region 603 in the region A602 being as the center. The distance from the center of a crystal growth end 605 can be made 1 μm or more (in FIG. 6, although it is schematically shown as a circle, an actual shape is arbitrary).

In a subsequent step, the island-like semiconductor layer 507 is subjected to a heat treatment at 300 to 450° C. in an atmosphere containing hydrogen of 3 to 100% or a heat treatment at 200 to 450° C. in an atmosphere containing hydrogen generated by plasma, so that remaining defects can be neutralized. When an active layer of a TFT is fabricated while the portion of the region A of the island-like semiconductor layer 507 fabricated in this way is made a channel formation region, the characteristics of the TFT can be improved.

Embodiment 2

A method of fabricating an island-like semiconductor layer having a crystal structure which is made an active layer of a TFT is not limited to only a laser annealing method, but both the laser annealing method of the present invention and a thermal annealing method may be used. Particularly, when crystallization by the thermal annealing method is applied to a crystallizing method using a catalytic element disclosed in Japanese Patent Unexamined Publication No. Hei. 7-130652, crystallization can be realized at a temperature of 600° C. or lower. When a crystalline semiconductor layer fabricated in this way is processed by the laser annealing method of the present invention, a crystalline semiconductor layer of high quality can be obtained. This embodiment will be described with reference to FIGS. 7A to 7D.

Figures 7A, 7B, 7C, 7D:
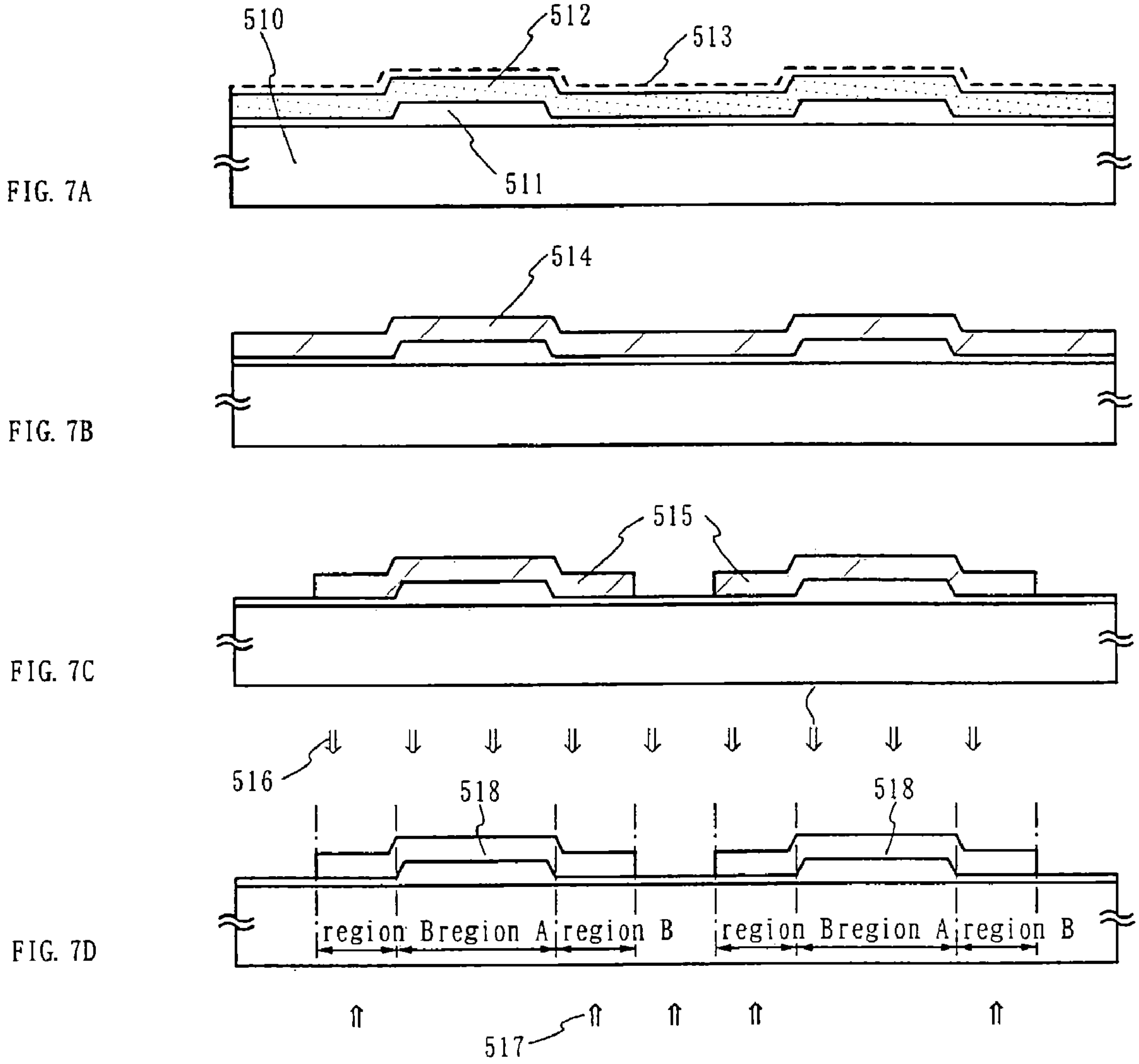
FIGS. 7A to 7D are views for explaining a fabricating process of an island-like semiconductor layer of the present invention.

In FIG. 7A, the glass substrate shown in the embodiment 1 can be preferably used as a substrate 510. In addition, abase film 511 and an amorphous semiconductor layer 512 are formed similarly to the embodiment 1. A solution containing a catalytic element of 5 to 100 ppm in terms of weight is applied by a spin coating method to form a layer 513 containing the catalytic element. Alternatively, the layer 513 containing the catalytic element may be formed even by a sputtering method or an evaporation method. In that case, the thickness of the layer 513 containing the catalytic element is made 0.5 to 2 nm. The catalytic element is nickel (Ni), germanium (Ge), iron (Fe), palladium (Pd), tin (Sn), lead (Pb), cobalt (Co), platinum (Pt), copper (Cu), gold (Au) ot the like.

Thereafter, a heat treatment at 400 to 500° C. for about 1 hour is first carried out, so that the hydrogen content of the amorphous semiconductor layer is made 5 atomic % or less. Then, a furnace for furnace annealing is used to carry out a thermal annealing in a nitrogen atmosphere at 550 to 60° C. for 1 to 8 hours, preferably at 550° C. for 4 hours. By the above steps, a crystalline semiconductor layer 514 made of a crystalline silicon film can be obtained (FIG. 7B). When the crystalline semiconductor layer fabricated by this heat annealing is macroscopically observed by an optical microscope, it is sometimes observed that an amorphous region locally remains. In such a case, according to the Raman spectroscopy, an amorphous component having a broad peak at 480 $cm^{-1}$ is observed similarly. However, such an amorphous region can be easily removed by the dual beam laser annealing method of the present invention, and an excellent crystalline semiconductor layer can be obtained.

As shown in FIG. 7C, an island-like semiconductor layer 515 is formed from the crystalline semiconductor layer 514. To the substrate in this state, as shown in FIG. 7D, the dual beam laser annealing is carried out similarly to the embodiment 1. As a result, an island-like semiconductor layer 518 having a crystal structure is newly formed after a melting state is once formed by a first laser beam 516 and a second laser beam 517. As compared with the island-like semiconductor layer 507 explained in FIGS. 5A to 5C, in the island-like semiconductor layer 518 fabricated in this way, a crystal grain of a comparable size or larger size can be fabricated in the region A as the center. However, the catalytic element of about $1\times10^{17}$ to $1\times10^{19}$ $cm^3$ is contained in the island-like semiconductor layer 518.

Embodiment 3

The crystallizing method of a semiconductor layer by the dual beam laser annealing method of the present invention is characterized in that the semiconductor layer formed into an island shape is made to have a temperature distribution, the region B rapidly cooled from the melted state and the region A in which the heat capacity of the under layer is large and which is gently cooled, are formed as explained in FIGS. 5 to 7, and a crystal of a large grain size is grown in the region A. Although the embodiment 1 and the embodiment 2 shows examples in which the thickness of the base film is changed to form the regions, such a structure can also be realized by using other methods.

Figure 8A:
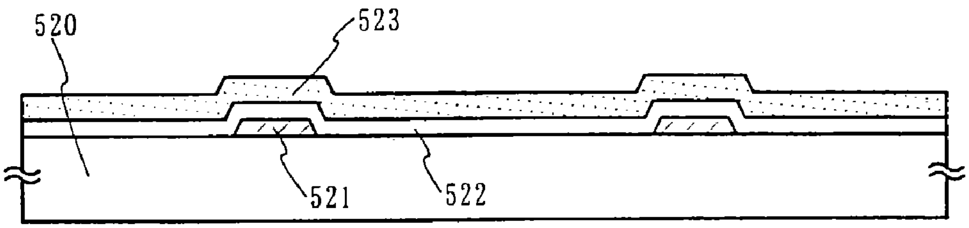
FIGS. 8A and 8B are views for explaining the fabricating process of the island-like semiconductor layer of the present invention.
Figure 8B:
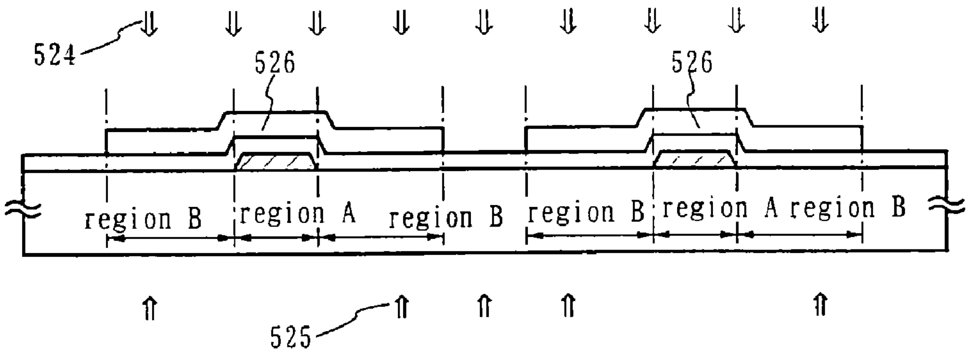

FIGS. 8A and 8B show an example of such methods. A heat conduction layer 521 made of tantalum (Ta), Ti, Cr, W, or the like and having a thickness of 30 to 100 nm is formed into an island shape on a substrate 520 of glass or the like set forth in the embodiment 1. A base film 522 provided thereon is not subjected to an etching process, and an amorphous semiconductor layer 523 is laminated. After an island-like semiconductor layer is formed from the amorphous semiconductor layer 523, a first laser beam 524 and a second laser beam 525 are irradiated by the dual beam laser annealing method, so that a similar crystalline semiconductor layer 526 can be obtained. In the crystalline semiconductor layer 526, a region where the heat conduction layer 521 is formed corresponds to the region A, and the other portion corresponds to the region B.

It is desirable that the heat conductivity of the heat conduction layer is 10 $Wm^{-1}K^{-1}$ or higher. As such a material, an oxide of aluminum (aluminum oxide ($Al_2O_3$)) has a heat conductivity of 20 $Wm^{-1}K^{-1}$ and is suitable. The aluminum oxide is not limited to a stoichiometric ratio, but other elements may be added to control the heat conductivity characteristics and the characteristics of internal stress or the like. For example, nitrogen is made to be contained in aluminum oxide and aluminum nitride oxide ($AlN_xO_{1-x}$: $0.02\leqq x\leqq 0.5$) may be used, or a nitride of aluminum ($AlN_x$) can also be used. Besides, a compound of silicon (Si), oxygen (O), nitrogen (N), and M (M is at least one selected from aluminum (Al) and rare earth elements) can be used. For example, AlSiON, LaSiON, or the like can be preferably used. In addition, boron nitride or the like can also be used. All the above oxide, nitride, and compounds can be formed by a sputtering method. This can be formed by using a target of desired composition and by using an inert gas such as argon (Ar) or nitrogen to perform sputtering.

Figure 9:
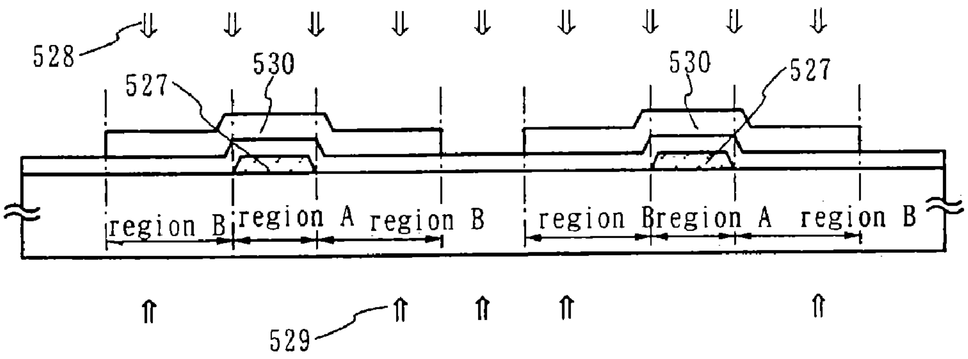
FIG. 9 is a view for explaining the fabricating process of the island-like semiconductor layer of the present invention.

FIG. 9 shows an example in which instead of the heat conduction layer 521 of FIGS. 8A and 8B, a translucent heat conduction layer 527 containing an aluminum oxide film, an aluminum nitride film, or an aluminum nitride oxide film as its main ingredient is provided. When such a structure is made, and a first laser beam 528 and a second laser beam 529 are irradiated by the dual beam laser annealing method, a similar crystalline semiconductor layer 530 can be obtained. Also here, in the crystalline semiconductor layer 530, a region where the insulating layer 527 is formed corresponds to the region A, and the other portion corresponds to the region B.

As described above, in this embodiment, although there has been described an example in which a method of using the temperature gradient of a semiconductor layer by providing the heat conduction layer under the base film is applied to the dual beam laser annealing method described in the embodiment 1, such a method may be combined with the embodiment 2 and is carried out.

Examples of the present invention will next be described below.

EXAMPLE 1

An example of the present invention will be described with reference to FIGS. 10A to 12B. Here, along steps, a description will be made on a method in which an n-channel TFT (hereinafter referred to as a pixel TFT) and a holding capacitance of a pixel portion, and an n-channel TFT and a p-channel TFT of a driving circuit provided at the periphery of the pixel portion are fabricated at the same time.

Figures 10A, 10B, 10C, 10D:
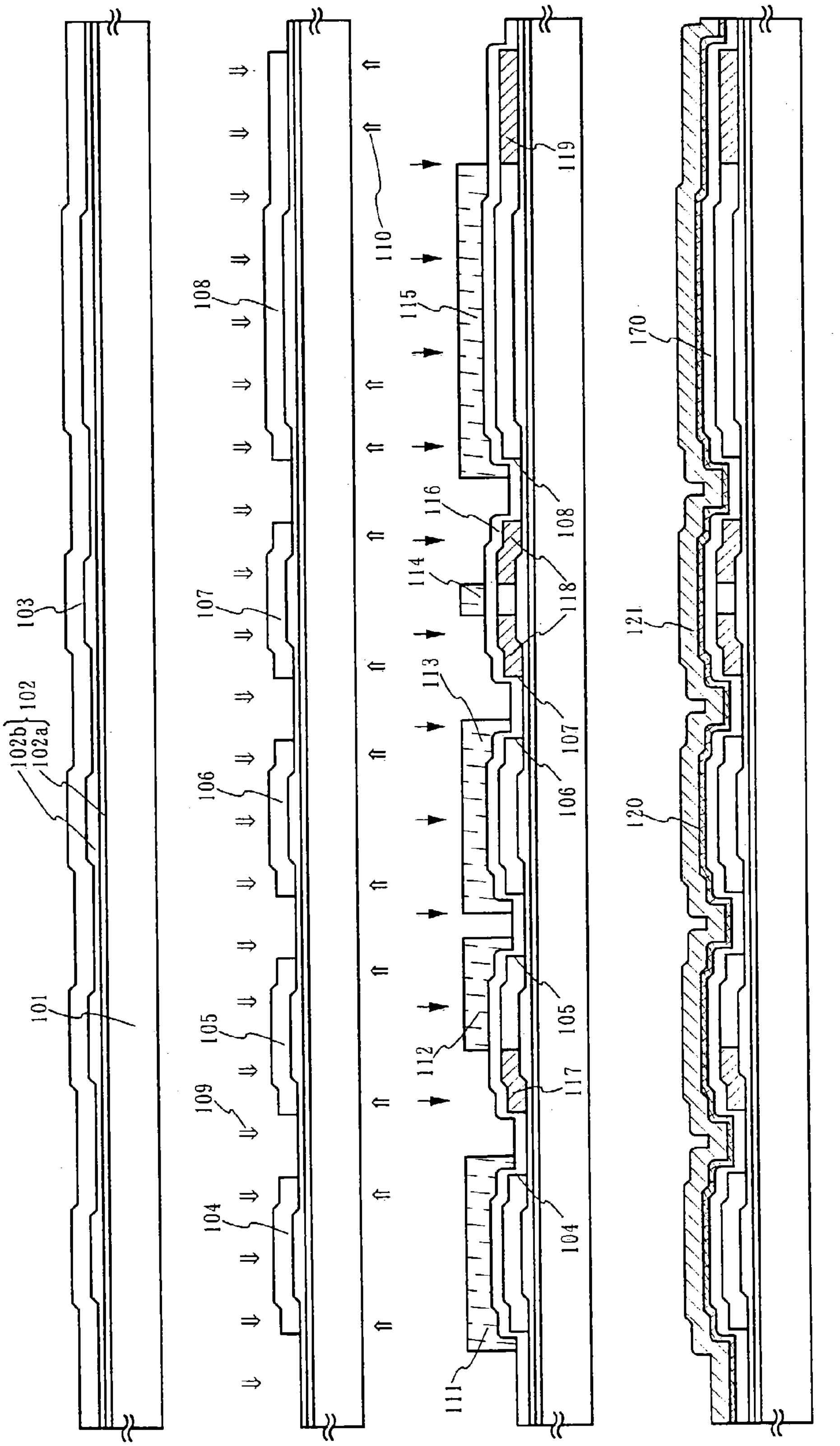
FIGS. 10A to 10D are sectional views for explaining a fabricating process of a pixel TFT and TFTs of a driving circuit.

In FIG. 10A, as a substrate 101, in addition to a glass substrate of barium borosilicate glass, alumino borosilicate glass, or the like typified by #7059 glass or #1737 glass of Corning Inc., in the case where a step of crystallization or activation is carried out by only a laser annealing method, a plastic substrate having no optical anisotropy, such as polyethylene terephthalate (PET), polyethylene naphthalate (PEN), or polyethersulfone (PES), can be used. In the case where the glass substrate is used, a heat treatment may be previously carried out at a temperature lower than glass distortion point by about 10 to 20° C.

Then, in order to prevent diffusion of an impurity from the substrate 101, a base film 102, such as a silicon oxide film, a silicon nitride film, or a silicon nitride oxide film, is formed on the surface of the substrate where an island-like semiconductor layer as an active layer of a TFT is to be formed. For example, a silicon nitride oxide film 102_a_ of 10 to 100 nm formed by a plasma CVD method from $SiH_4$, $NH_3$, and $N_2O$ and a hydrogenated silicon nitride oxide film 102_b_ of 100 to 200 nm similarly formed from $SiH_4$ and $N_2O$ are laminated. Like this, although the base film 102 may be made a two-layer structure, one layer of the above materials may be formed, or a laminate structure of more than two layers may be formed. In any event, the film is formed to a thickness of about 100 to 300 nm.

The silicon nitride oxide film is formed by using a conventional parallel plate type plasma CVD method. With respect to the silicon nitride oxide film 102_a_, $SiH_4$ of 10 SCCM, $NH_3$ of 100 SCCM, and $N_2O$ of 20 SCCM were introduced into a reaction chamber, and substrate temperature of 325° C., reaction pressure of 40 Pa, discharge power density of 0.41 $W/cm^2$, discharge frequency of 60 MHz were used. On the other hand, with respect to the hydrogenated silicon nitride oxide film 102*b*, $SiH_4$ of 5 SCCM, $N_2O$ of 120 SCCM, and $H_2$ of 125 SCCM were introduced into the reaction chamber, and substrate temperature of 400° C., reaction pressure of 20 Pa, discharge power density of 0.41 $W/cm^2$, and discharge frequency of 60 MHz were used. These films can also be continuously formed by only changing the substrate temperature and switching the reaction gases. The silicon nitride oxide film 102*a* is formed so that the inner stress becomes tensile stress when the substrate is regarded as the center. Although the silicon nitride oxide film 102*b* is also made to have the inner stress in the same direction, the stress in the absolute value is made smaller than that of the silicon nitride oxide film 102*a*.

In order to form a thick portion and a thin portion in the base film 102, a resist mask is formed by a photolithography technique, and an etching process is carried out. Although a stepped portion is determined by the amount of etching, it is preferable to make the amount approximately 30 to 100 nm. For example, in order to etch the silicon nitride oxide film 102*b* of 150 nm by 75 nm, a wet etching using a solution containing hydrofluoric acid may be used, or a dry etching using $CF_4$ or the like can be applied. In this way, a convex shape is formed in the base film 102, and the structure schematically shown in FIG. 10A is formed. At this time, although the size of the convex portion may be suitably determined in view of the size of a TFT to be fabricated, for the purpose of controlling the generation number of crystal nuclei, the size (diameter or length of a diagonal) of about 2 to 6 μm is preferable.

Next, a semiconductor layer 103 having a thickness of 25 to 80 nm (preferably 30 to 60 nm) and an amorphous structure is formed by a method such as a plasma CVD method or a sputtering method. For example, the amorphous silicon film having a thickness of 55 nm is formed by the plasma CVD method. A semiconductor film having an amorphous structure includes an amorphous semiconductor layer and a microcrystalline semiconductor film, and a compound semiconductor film having an amorphous structure, such as an amorphous silicon germanium film or an amorphous silicon carbide film, may also be used.

Figure 13A:
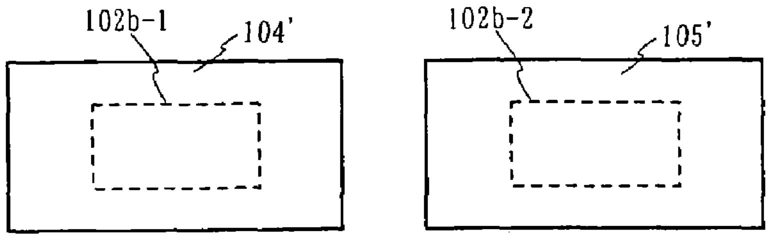
FIGS. 13A to 13D are top views showing a fabricating process of a TFT of a driving circuit.
Figure 13B:
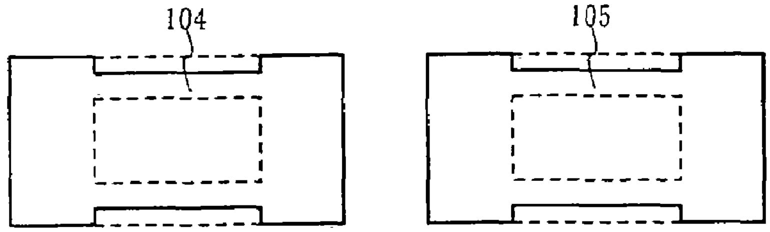
Figure 13C:
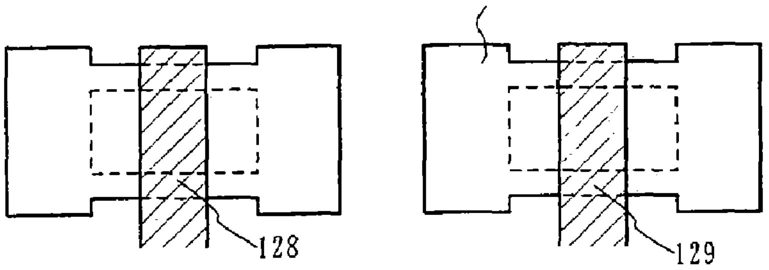

First, island-like semiconductor layers 104' to 108' having first shapes as shown in FIG. 10B are formed from the semiconductor layer 103 having the amorphous structure by a well-known photolithography method. FIG. 13A is a top view of the island-like semiconductor layers 104' and 105' in this state, and similarly, FIG. 14A is a top view of the island-like semiconductor layer 108'. In FIGS. 13A to 13D and FIGS. 14A to 14D, although the island-like semiconductor layer is made rectangular and is formed so that one side has a length of 50 μm or less, the shape of the island-like semiconductor layer can be made arbitrary, and preferably, as long as the layer has such a shape that the minimum distance between its center and the end portion becomes 50 μm or less, any polygon or circle may be formed. Reference characters 102*b*-1 and 102*b*-2 of FIGS. 13A and 102*b*-5 of FIG. 14A designate regions of convex portions of the base film 102 formed under the respective island-like semiconductor layers. This convex portion corresponds to the region A explained in the embodiments 1 to 3, and its periphery corresponds to the region B.

Next, a crystallizing step is carried out to the island-like semiconductor layers 104' to 108' having such first shapes. As the crystallizing step, any method explained in the embodiments 1 to 3 can be applied. In any event, by applying the dual beam laser annealing method of the present invention, the island-like semiconductor layers 104' to 108' having the first shapes of FIG. 10B can be newly crystallized. In this case, the film is densified with the crystallization of the amorphous silicon film and is contracted by about 1 to 15%. Thus, it is conceivable that the island-like semiconductor layer made of such a crystalline silicon film has tensile stress when the substrate is regarded as the center.

In the island-like semiconductor layer made of the crystalline semiconductor layer fabricated in this way, a large crystal grain is obtained mainly in the region of the convex portion, and a crystal grain becomes small in the vicinity of the end portion of the island-like semiconductor layer. Thus, the characteristics of the crystal become deteriorated, and even if a channel formation region of a TFT is formed in this portion, the characteristics of field effect mobility or the like become deteriorated.

Figure 14A:
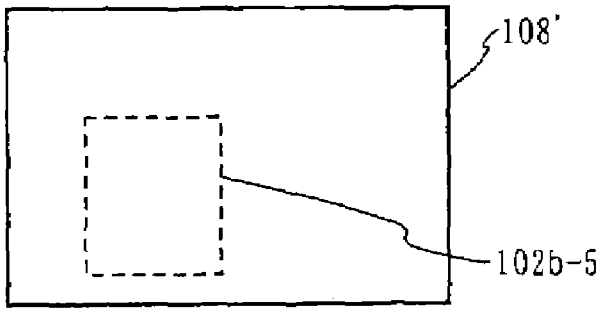
FIGS. 14A to 14D are top views showing a fabricating process of a pixel TFT.
Figure 14B:
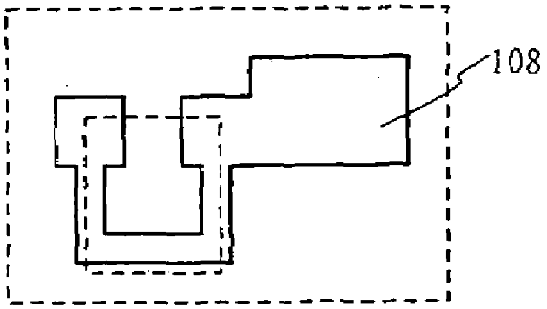

If a gate electrode of a TFT is formed to extend to the region having the poor characteristics of the crystal like this, excellent TFT characteristics can not be expected. Further, there is also a possibility that an off current value (value of current flowing in an off state of a TFT) is increased, or a current is concentrated in this region and heat is locally generated. Thus, as shown in FIGS. 13B and 14B, in order that the gate electrode does not extend to the end of the first shape island-like semiconductor layer, second shape island-like layers 104, 105 and 108 are formed. Regions 104', 105' and 108' indicated by dotted lines in the drawings indicate regions where the first shape island-like semiconductor layers existed, and are removed by etching so that the gate electrode does not overlap with at least the end portion of the region. The shape of the second shape island-like semiconductor layers 104, 105 and 108 may be made arbitrary. The other island-like semiconductor layers shown in FIG. 10B are also similarly treated.

After the second shape island-like semiconductor layers 104 to 108 are formed, a mask layer 116 having a thickness of 50 to 100 nm and made of a silicon oxide film is formed to cover the island-like semiconductor layers 104 to 108 by the plasma CVD method or sputtering method. To the island-like semiconductor layers, for the purpose of controlling the threshold voltage (Vth) of a TFT, an impurity to give a p type may be added at a concentration of about $1\times10^{16}$ to $5\times10^{17}/cm^3$ to all the surfaces of the island-like semiconductor layers. As an impurity to give the p type to a semiconductor, an element in group 13 of the periodic table, such as boron (B), aluminum (Al), or gallium (Ga), is known. Although an ion implantation method or ion doping method may be used as the method, the ion doping method is suitable for processing a large area substrate. In the ion doping method, diborane ($B_2H_6$) is used as a source gas, and boron (B) is added. Although injection of such an impurity element is not always necessary and may be omitted, it is a method preferably used especially for restricting the threshold voltage of an n-channel TFT within a predetermined range.

In order to form an LDD region of the n-channel TFT of the driving circuit, an impurity element to give an n type is selectively added to the island-like semiconductor layers 105 and 107. For that purpose, resist masks 111 to 115 are formed in advance. As an impurity element to give the n type, phosphorus (P) or arsenic (As) may be used, and here, an ion doping method using phosphine ($PH_3$) is used to add phosphorus (P). In the present specification, impurity regions 117 and 118 formed here are called first low concentration n-type impurity regions, and the concentration of phosphorus (P) in this region is made within the range of $2\times10^{16}$ to $5\times10^{19}/cm^3$. The concentration is expressed by ($n^-$). An impurity region 119 is a semiconductor layer for forming a holding capacity of a pixel matrix circuit, and phosphorus (P) with the same concentration is added also in this region (FIG. 10C).

Next, a step of activating the added impurity element is carried out. Activation can be made by a heat treatment in a nitrogen atmosphere at 500 to 600° C. for 1 to 4 hours, or a laser activation method. Both may be carried out at the same time. In the case of the method of the laser activation, a KrF excimer laser beam (wavelength of 248 nm) was used and a linear beam was formed, and under the conditions that the oscillation frequency was 5 to 50 Hz, the energy density was 100 to 500 $mJ/cm^2$, and the overlap ratio of the linear beam was 80 to 98%, scanning was made so that the entire surface of the substrate where the island-like semiconductor layers were formed was processed. Incidentally, irradiation conditions of the laser beam are not limited, but the user may suitably determine. At this stage, the mask layer 116 is removed by etching using a solution of hydrofluoric acid or the like.

In FIG. 10D, a gate insulating film 170 is formed of an insulating film having a thickness of 40 to 150 nm and containing silicon by using a plasma CVD method or sputtering method. For example, a silicon nitride oxide film having a thickness of 120 mm is formed. Besides, in a silicon nitride oxide film formed by adding $O_2$ to $SiH_4$ and $N_2O$, a fixed charge density in the film is lowered, and it is a preferable material for this usage. Of course, the gate insulating film 170 is not limited to such a silicon nitride oxide film, but other insulating films containing silicon may be used as a single layer or a laminate structure. In any event, the gate insulating film 170 is formed to have compression stress when the substrate is regarded as the center.

Then, as shown in FIG. 10D, a heat resistant conductive layer for forming a gate electrode is formed on the gate insulating film 170. Although the heat resistant conductive layer may be formed of a single layer, a laminate structure made of plural layers, such as two layers or three layers, may be formed, as needed. It is appropriate that the heat resistant conductive material like this is used and such a structure is adopted that a conductive layer (A) 120 made of a conductive metal nitride film and a conductive layer (B) 121 made of a metal film are laminated. The conductive layer (B) 121 may be formed of an element selected from Ta, Ti, molybdenum (Mo), and W, or an alloy containing the foregoing element as its main ingredient, or an alloy film of a combination of the elements (typically Mo—W alloy film, Mo—Ta alloy film). The conductive layer (A) 120 is formed of tantalum nitride (TaN), WN, TiN, molybdenum nitride (MoN) or the like. Besides, the conductive layer (A) 120 may also be formed of tungsten silicide, titanium silicide, or molybdenum silicide. With respect to the conductive layer (B) 121, in order to lower the resistance, it is preferable to decrease the concentration of the contained impurity, and especially, it was appropriate that the oxygen concentration was made 30 ppm or less. For example, with respect to W, when the oxygen concentration is made 30 ppm or less, a specific resistance value of 20 μΩcm or less can be realized.

It is appropriate that the thickness of the conductive layer (A) 120 is made 10 to 50 nm (preferably 20 to 30 nm), and the thickness of the conductive layer (B) 121 is made 200 to 400 nm (preferably 250 to 350 nm). In the case where the gate electrode is formed of the W film, the conductive layer (A) 120 is formed of a WN film having a thickness of 50 nm by a sputtering method using W as a target and introducing an argon (Ar) gas and nitrogen ($N_2$) gas, and the conductive layer (B) 121 is formed of a W film having a thickness of 250 nm. As another method, the W film can also be formed by a thermal CVD method using tungsten hexafluoride ($WF_6$). In any event, in order to use it as the gate electrode, it is necessary to decrease the resistance, and it is desirable to make the resistivity of the W film 20 μΩcm or less. Although the resistivity of the W film can be decreased by enlarge the crystal grain, in the case where many impurity elements such as oxygen are contained in the W film, crystallization is blocked and the resistance is increased. From this, in the case of the sputtering method, when a W target of purity of 99.9999% is used, and the W film is formed by sufficiently paying attention so that an impurity is not mixed from a vapor phase during the film formation, the resistivity of 9 to 20 μΩcm can be realized.

On the other hand, in the case where a TaN film is used for the conductive layer (A) 120 and a Ta film is used for the conductive layer (B) 121, they can be formed similarly by the sputtering method. The TaN film is formed by using a target of Ta and a mixed gas of Ar and nitrogen as a sputtering gas, and the Ta film is formed by using Ar as the sputtering gas. If a suitable amount of Xe or Kr is added to the sputtering gas, the internal stress of the formed film is relieved, and peeling of the film can be prevented. The resistivity of α-phase Ta film is about 20 μΩcm and can be used for the gate electrode. However, the resistivity of β-phase Ta film is about 180 μΩcm and is not suitable for the gate electrode. Since the TaN film has a crystal structure close to the α-phase, if the Ta film is formed thereon, the α-phase Ta film can be easily obtained. Although not shown, it is effective to form a silicon film having a thickness of about 2 to 20 nm and doped with phosphorus (P) under the conductive layer (A) 120. By this, the improvement of adhesion of the conductive film formed thereon and prevention of oxidation are realized, and at the same time, it is possible to prevent a trace amount of alkali metal element contained in the conductive layer (A) 120 or the conductive layer (B) 121 from diffusing. In any event, it is preferable that the resistivity of the conductive layer (B) 121 is made in the range of 10 to 50 μΩcm.

Figures 11A, 11B, 11C, 11D:
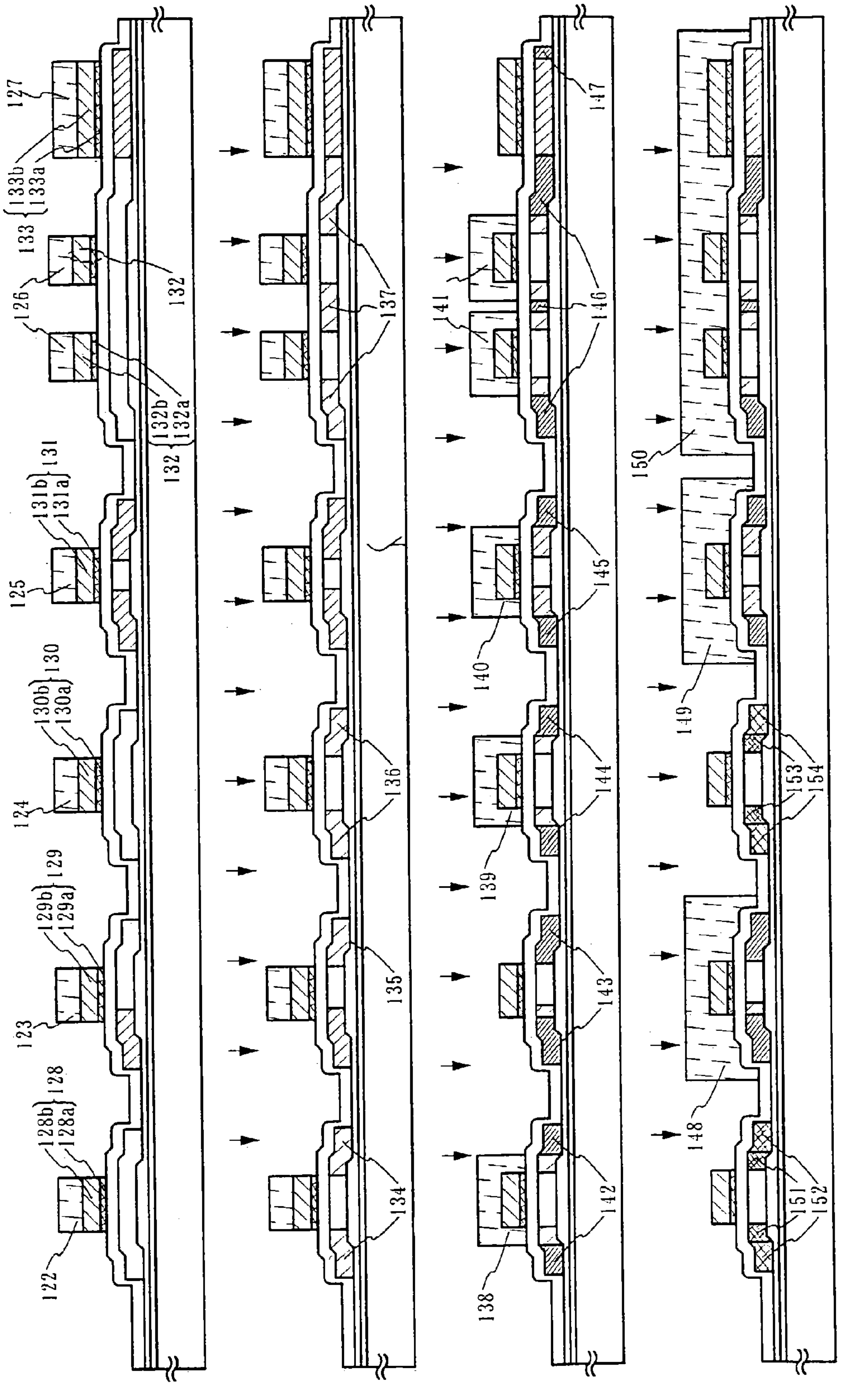
FIGS. 11A to 11D are sectional views for explaining the fabricating process of the pixel TFT and the TFTs of the driving circuit.
Figure 14C:
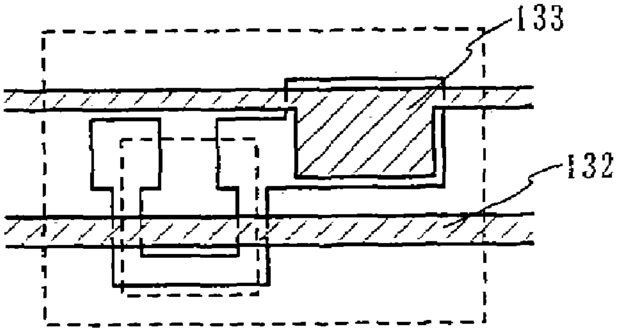

Then, resist masks 122 to 127 are formed by using the photolithography technique, and the conductive layer (A) 120 and the conductive layer (B) 121 are simultaneously etched to form gate electrodes 128 to 132 and a capacitance wiring line 133. In the gate electrodes 128 to 132 and the capacitance wiring line 133, portions **128*a* to 132*a* made of the conductive layer (A) and portions 128*b* to 132*b* made of the conductive layer (B) are integrally formed (FIG. 11A). The positional relation among the island-like semiconductor layers 104 and 105 and the gate electrodes 128 and 129 in this state is shown in a top view of FIG. 13C. Similarly, the relation among the island-like semiconductor layer 108, the gate electrode 132, and the capacitance wiring line 133 is shown in FIG. 14C. In FIGS. 13C and 14C, the gate insulating film 170** is omitted.

Although a method of etching the conductive layer (A) and the conductive layer (B) may be suitably selected by the user, in the case where the layer is formed of a material containing W as its main ingredient as described above, it is desirable to use a dry etching method using high density plasma in order to carry out an etching at high speed and with high precision. As a method of obtaining the high density plasma, a microwave plasma or inductively coupled plasma (ICP) etching device may be used. For example, in the etching method of W using the ICP etching device, as an etching gas, two kinds of gases of $CF_4$ and $Cl_2$ are introduced in a reaction chamber, the pressure is made 0.5 to 1.5 Pa (preferably 1 Pa), and the high frequency (13.56 MHz) power of 200 to 1000 W is applied to an inductively coupled portion. At this time, the high frequency power of 20 W is applied to the stage where the substrate is put, and it is charged to a negative potential by self-bias, so that a positive ion is accelerated and an anisotropic etching can be carried out. By using the ICP etching device, even the hard metal film of W or the like can also be etched at an etching rate of 2 to 5 nm/second. In order to carry out the etching without leaving the residue, it is appropriate that an etching time is increased at a ratio of about 10 to 20% to carry out over etching. However, at this time, it is necessary to pay attention to a selection ratio of etching to the under layer. For example, since the selection ratio of the silicon nitride oxide film (gate insulating film 170) to the W film is 2.5 to 3, the surface where the silicon nitride oxide film was exposed by such an over etching process, was etched by about 20 to 50 nm and became substantially thin.

Then, in order to form an LDD region in the pixel TFT, a step of adding an impurity element to give an n type ($n^-$ doping step) is carried out. Here, the impurity element to give the n type is added by an ion doping method using the gate electrodes 128 to 132 as masks in a self-aligned manner. The concentration of phosphorus (P) added as the impurity to give the n type is within the range of $1\times10^{16}$ to $5\times10^{19}/cm^3$. In this way, as shown in FIG. 11B, second low concentration n-type impurity regions 134 to 137 are formed in the island-like semiconductor layers.

Next, to the island-like semiconductor layers forming the n-channel TFTs, high concentration n-type impurity regions functioning source regions or drain regions are formed ($n^+$ doping step). First, resist masks 138 to 141 are formed, and an impurity element to give the n type is added to form high concentration n-type impurity regions 142 to 147. Phosphorus (P) is used as the impurity element to give the n type in this region, and an ion doping method using phosphine ($PH_3$) is carried out so that its concentration becomes within the range of $1\times10^{20}$ to $1\times10^{21}/cm^3$ (FIG. 11C).

Then, in the island-like semiconductor layers 104 and 106 for forming the p-channel TFTs, high concentration p-type impurity regions 151 to 154 as source regions or drain regions are formed. Here, the gate electrodes 128 and 130 are used as masks, and an impurity element to give the p type is added to form the high concentration p-type impurity regions in a self-aligned manner. At this time, resist masks 148 to 150 are formed to cover all the surfaces of the island-like semiconductor films 105, 107, and 108 for forming the n-channel TFTs. The high concentration p-type impurity regions 151 to 154 are formed by an ion doping method using diborane ($B_2H_6$). The boron (B) concentration in this region is made $3\times10^{20}$ to $3\times10^{21}/cm^3$ (FIG. 11D). In the high concentration p-type impurity regions 151 to 154, phosphorus (P) is added in the prior steps, and the high concentration p-type impurity regions 152 and 154 contain phosphorus at a concentration of $1\times10^{20}$ to $1\times10^{21}/cm^3$, and the high concentration p-type impurity regions 151 and 153 contain phosphorus at a concentration of $1\times10^{16}$ to $5\times10^{19}/cm^3$. However, since the concentration of boron (B) added in this step is made 1.5 to 3 times as high as that of phosphorus, there occurs no problem in functioning as the source region and drain region of the p-channel TFT.

Figure 12A:
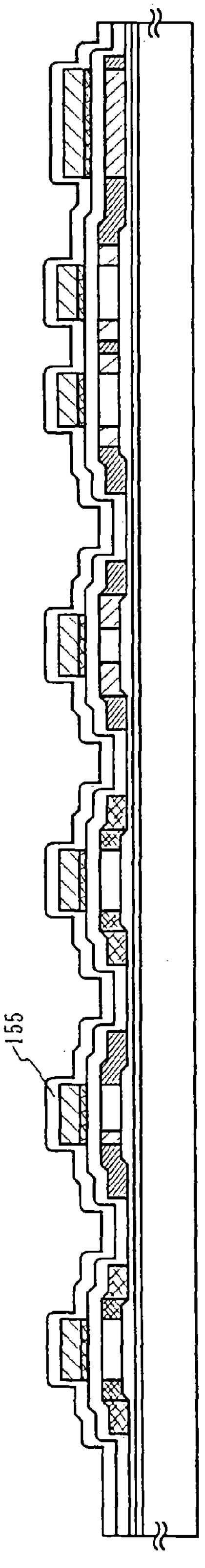
FIGS. 12A and 12B are views for explaining the fabricating process of the pixel TFT and the TFTs of the driving circuit.

Thereafter, as shown in FIG. 12A, a first interlayer insulating film 155 is formed from gate electrodes and gate insulating films. The first interlayer insulating film may be formed of a silicon oxide film, a silicon nitride oxide film, a silicon nitride film, or a laminate film of a combination of these. In any event, the first interlayer insulating film 155 is formed of an inorganic insulator material. The thickness of the first interlayer insulating film 155 is made 100 to 200 nm. Here, in the case where the silicon oxide film is used, the film can be formed by a plasma CVD method in which discharge is made under the conditions that tetraethyl ortho silicate (TEOS) and $O_2$ are mixed, the reaction pressure is made 40 Pa, the substrate temperature is made 300 to 400° C., and the high frequency (13.56 MHz) power density is 0.5 to 0.8 W/cm$^2$. In the case where the silicon nitride oxide film is used, the film may be formed of a silicon nitride oxide film fabricated from $SiH_4$, $N_2O$, and $NH_3$ by the plasma CVD method, or a silicon nitride oxide film fabricated from $SiH_4$ and $N_2O$. In this case, the film can be formed under fabricating conditions that the reaction pressure is 20 to 200 Pa, the substrate temperature is 300 to 400° C., and the high frequency (60 MHz) power density is 0.1 to 1.0 W/cm$^2$. Besides, a hydrogenated silicon nitride oxide film fabricated from $SiH_4$, $N_2O$, and $H_2$ may be used. Similarly, the silicon nitride film can be fabricated from $SiH_4$ and $NH_3$ by the plasma CVD method. Such first interlayer insulating film is formed so as to have compression stress when the substrate is regarded as the center.

Thereafter, a step of activating the impurity element to give the n type or p type, which was added at its own concentration, is carried out. This step is carried out by a thermal annealing method using a furnace for furnace annealing. In addition, a laser annealing method or a rapid thermal annealing method (RTA method) can be used. The thermal annealing method is carried out in a nitrogen atmosphere containing oxygen of a concentration of 1 ppm or less, preferably 0.1 ppm or less, at 400 to 700° C., typically 500 to 600° C. In this example, a heat treatment at 550° C. for 4 hours was carried out. In the case where a plastic substrate with a low heat resisting temperature is used as the substrate 101, it is preferable to use the laser annealing method.

After the step of activation, further, a heat treatment at 300 to 450° C. for 1 to 12 hours is carried out in an atmosphere containing hydrogen of 3 to 100%, and a step of hydrogenating the second shape island-like semiconductor layer is carried out. This step is a step of terminating dangling bonds of $10^{16}$ to $10^{18}/cm^3$ existing in the second shape island-like semiconductor layer by thermally excited hydrogen. As another means of hydrogenating, plasma hydrogenating (using hydrogen excited by plasma) may be carried out. Besides, by a heat treatment at 300 to 450° C., the island-like semiconductor layer may be hydrogenated by diffusing hydrogen of the hydrogenated silicon nitride oxide film of the base film 102 and the silicon nitride oxide film of the first interlayer insulating film 155.

After the steps of activation and hydrogenating are ended, a second interlayer insulating film 156 made of organic insulating material is formed to an average thickness of 1.0 to 2.0 μm. As the organic resin material, polyimide, acryl, polyamide, polyimidoamid, BCB (benzocyclobutene), or the like can be used. For example, in the case where polyimide of a type which is thermally polymerized after application onto a substrate is used, a clean oven is used and sintering is made at 300° C. to form the film. In the case where acryl is used, a two-liquid type is used, and after a main material and a hardening agent are mixed, a spinner is used to apply it onto the entire surface of a substrate, and then, preheating at 80° C. for 60 seconds is carried out by a hot plate, and further, a clean oven is used and sintering at 250° C. for 60 minutes is carried out to form the film.

The second interlayer insulating film is formed of the organic insulator material, so that the surface can be excellently flattened. Besides, since the organic resin material has generally low dielectric constant, parasitic capacitance can be lowered. However, since it has a hygroscopic property and is not suitable for a protecting film, as in this example, it is necessary to use the material in combination with the silicon oxide film, silicon nitride oxide film, silicon nitride film, or the like.

Thereafter, a photomask is used to form a resist mask of a predetermined pattern, and contact holes reaching source regions or drain regions formed in the respective island-like semiconductor films are formed. The contact holes are formed by a dry etching method. In this case, a mixed gas of $CF_4$, $O_2$, and He is used as an etching gas, and the second interlayer insulating film 156 made of the organic resin material is first etched, and thereafter, an etching gas is made $CF_4$ and $O_2$, and the first insulating film 155 is etched. Further, in order to raise the selection ratio to the island-like semiconductor layer, an etching gas is changed to $CHF_3$ to etch the gate insulating film 170, so that the contact holes can be excellently formed.

Then, a conductive metal film is formed by a sputtering method or a vacuum evaporation method, a resist mask pattern is formed, and source wiring lines 157 to 161 and drain wiring lines 162 and 166 are formed by etching. A drain wiring line 167 indicates a drain wiring line of an adjacent pixel. Here, the drain wiring line 166 functions as a pixel electrode. Although not shown, in this example, this electrode is wired in such a manner that a Ti film having a thickness of 50 to 150 nm is formed, a contact to the semiconductor film forming the source or drain region of the island-like semiconductor layer is formed, and aluminum (Al) having a thickness of 300 to 400 nm is formed to overlap with the Ti film.

Figure 13D:
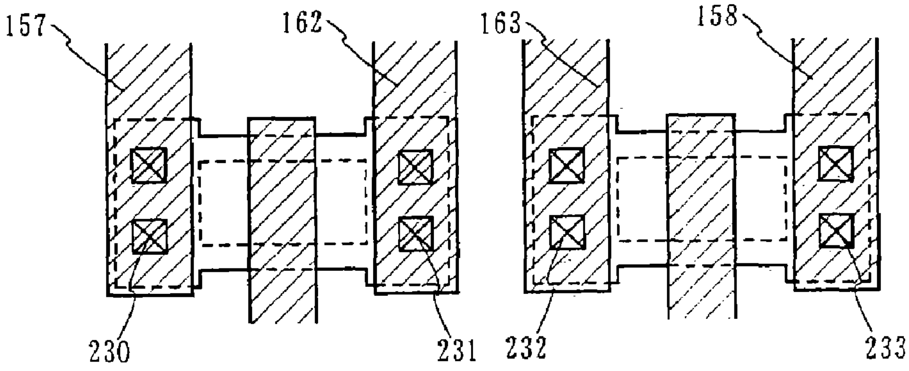
Figure 14D:
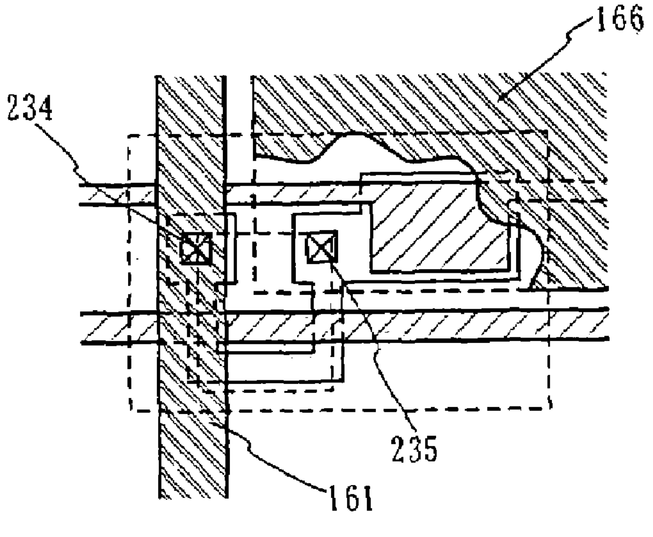

FIG. 13D is a top view showing, in this state, the island-like semiconductor layers 104 and 105, the gate electrodes 128 and 129, the source wiring lines 157 and 158, and the drain wiring lines 162 and 163. The source wiring lines 157 and 158 are connected to the island-like semiconductor layers 104 and 105 at portions 230 and 233 through not-shown contact holes provided in the second interlayer insulating film and the first interlayer insulating film, respectively. The drain wiring line 162 and 163 are connected to the island-like semiconductor layers 104 and 105 at portions 231 and 232, respectively. Similarly, FIG. 14D is a top view showing the island-like semiconductor layer 108, the gate electrode 132, the capacitance wiring line 133, the source wiring line 161, and the drain wiring line 166. The source wiring line 161 and the drain wiring line 166 are connected through contact portion 234 and contact portion 235 to the island-like semiconductor layer 108, respectively.

In this state, a heat treatment is carried out to improve contact of the contact portions between the source wiring lines 157 to 161, the drain wiring lines 162 to 166 and their respective island-like semiconductor layers. The heat treatment is carried out by using a clean oven and within the range of 200 to 300° C. and 1 to 4 hours.

In this way, the substrate including the TFTs of the driving circuit and the pixel TFT of the pixel portion on the same substrate can be completed. In the driving circuit, a first p-channel TFT 200, a first n-channel TFT 201, a second p-channel TFT 202, and a second n-channel TFT 203 are formed. In the pixel portion, a pixel TFT 204, and a holding capacitance 205 are formed. In the present specification, for convenience, such a substrate is called an active matrix substrate.

Figure 12B:
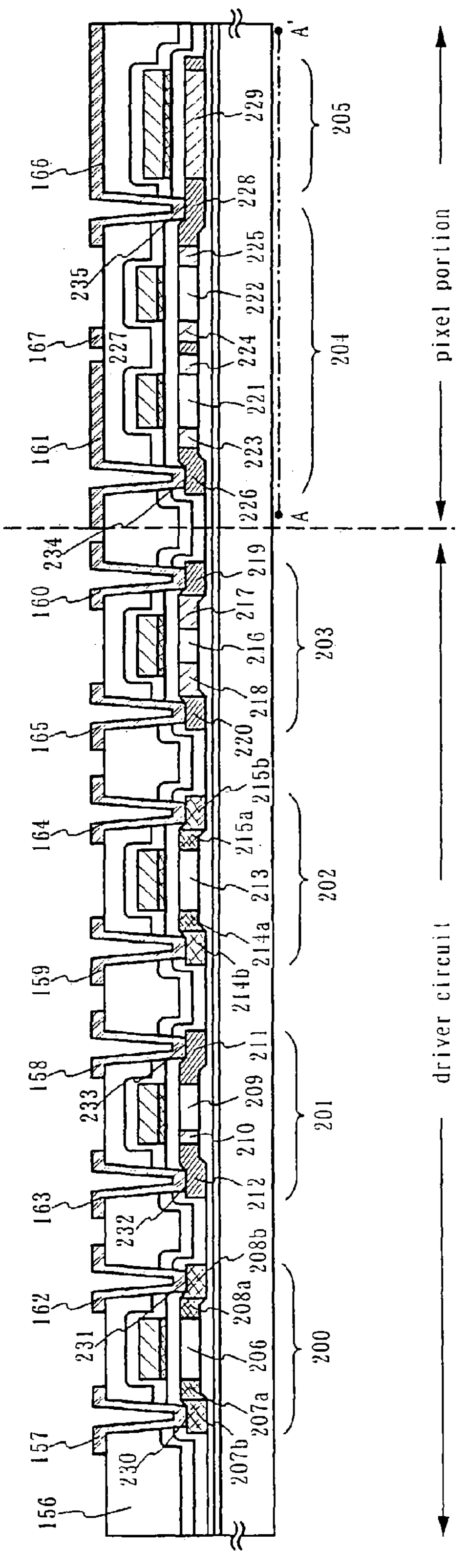

The first p-channel TFT 200 of the driving circuit has a single drain structure including, in the second shape island-like semiconductor film 104, a channel formation region 206, source regions 207*a* and 207*b*, and drain regions 208*a* and 208*b*, which are made of high concentration p-type impurity regions. The first n-channel TFT 201 includes, in the second shape island-like semiconductor film 105, a channel formation region 209, an LDD region 210 overlapping with the gate electrode 129, a source region 212, and a drain region 211. In this LDD region, the LDD region overlapping with the gate electrode 129 is designated by Lov, and its length in the channel length direction was made 0.5 to 3.0 μm, preferably 1.0 to 2.0 μm. By setting the length of the LDD region in the n-channel TFT in this way, a high electric field generated in the vicinity of the drain region is relieved, generation of a hot carrier is prevented, and deterioration of the TFT can be prevented. Similarly, the second p-channel TFT 202 of the driving circuit has a single drain structure including, in the second shape island-like semiconductor film 106, a channel formation region 213, source regions 214*a* and 214*b*, drain regions 215*a* and 215*b*, which are made of high concentration p-type impurity regions. The second n-channel TFT 203 includes, in the second shape island-like semiconductor film 107, a channel formation region 216, LDD regions 217 and 218 partially overlapping with the gate electrode 131, a source region 220, and a drain region 219. The length of the region Lov overlapping with the gate electrode of the TFT was also made 0.5 to 3.0 μm, preferably 1.0 to 2.0 μm. The LDD region not overlapping with the gate electrode 131 is designated by Loff, and its length in the channel length direction was made 0.5 to 4.0 μm, preferably 1.0 to 2.0 μm. The pixel 204 includes, in the island-like semiconductor film 108, channel formation regions 221 and 222, LDD regions 223 to 225, and source or drain regions 226 to 228. The length of the LDD region (Loff) in the channel length direction is 0.5 to 4.0 μm, preferably 1.5 to 2.5 μm. Further, the holding capacitance 205 is formed of the capacitance wiring line 133, an insulating film made of the same material as the gate insulating film, and a semiconductor layer 229 connecting with the drain region 228 of the pixel TFT 204. In FIG. 12B, although the pixel TFT 204 is made a double gate structure, a single gate structure may be adopted, or a multi-gate structure in which a plurality of gate electrodes are provided may be adopted.

Figure 15:
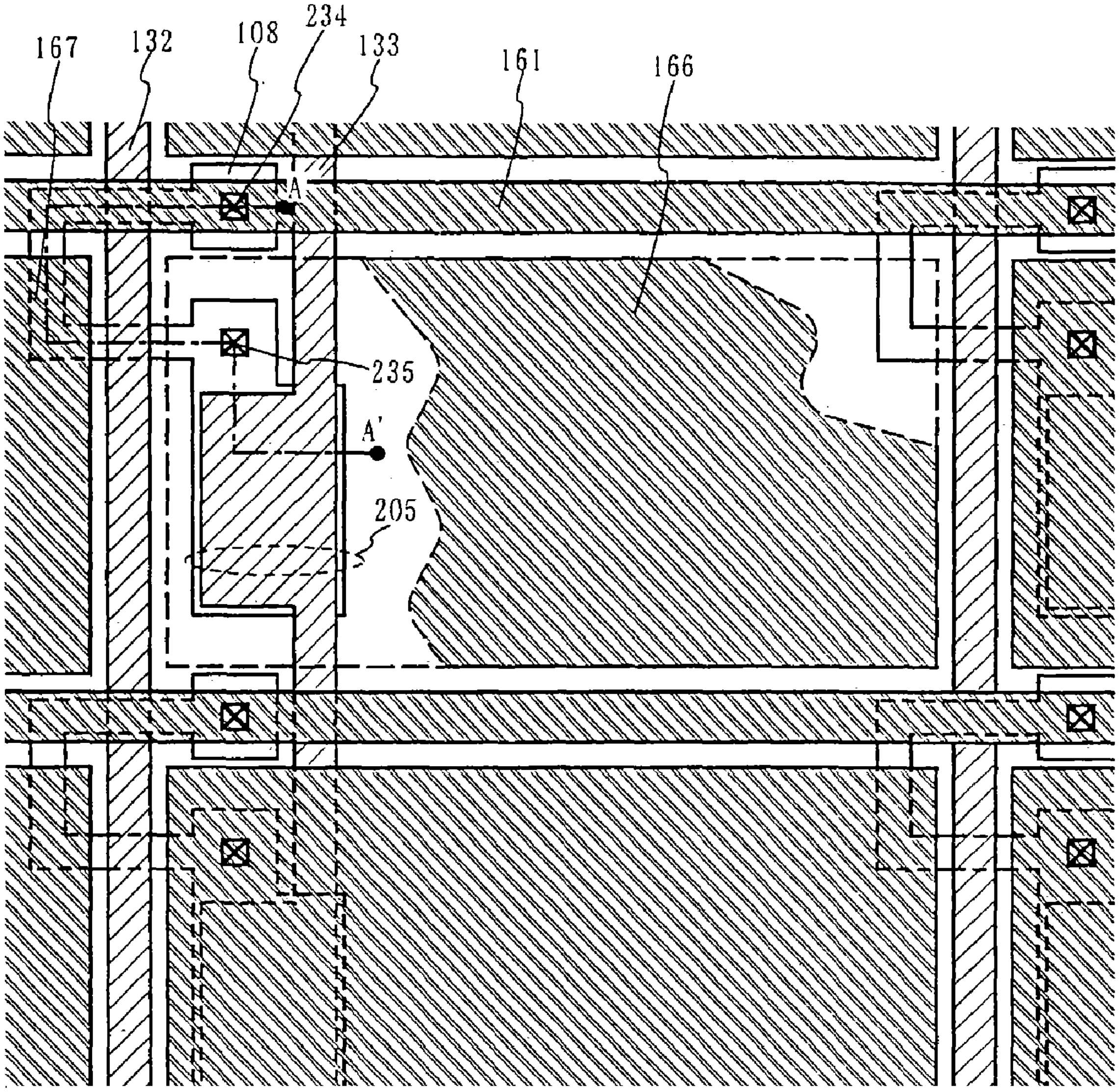
FIG. 15 is a top view showing a pixel structure of a pixel portion.

FIG. 15 is a top view showing substantially one pixel of the pixel portion of such an active matrix substrate. A section taken along A-A' in the drawing corresponds to the sectional view of the pixel portion shown in FIG. 12B. In the pixel TFT 204, the gate electrode 132 serving also as the gate wiring line intersects with the under island-like semiconductor layer 108 through a not-shown gate insulating film. Although not shown, the source region, the drain region, and the LDD region are formed in the island-like semiconductor layer. Reference numeral 234 designates a contact portion between the source wiring line 161 and the source region 226; 235, a contact portion between the drain wiring line 166 and the drain region 228. The holding capacitance 205 is formed at a region where the semiconductor layer 229 extending from the drain region 228 of the pixel TFT 204 overlaps with the capacitance wiring line 133 through the gate insulating film.

The second shape island-like semiconductor layer formed through the foregoing steps by the dual beam laser annealing method of the present invention has such a structure that the size of a crystal grain is enlarged especially in the channel formation region and grain boundaries are few. The second shape island-like semiconductor layer like this is used, and the structures of the pixel TFT and the TFTs constituting each circuit are optimized in accordance with the specification required by the driving circuit, so that it becomes possible to improve the operation performance and reliability of the semiconductor device. Further, activation of the LDD region, the source region and the drain region is facilitated by forming the gate electrode out of the conductive material having heat resistance. Then, a high quality display device can be realized by such an active matrix substrate. From the active matrix substrate fabricated in this example, a reflection type liquid crystal display device can be fabricated.

EXAMPLE 2

The active matrix substrate fabricated in the example 1 can be directly used for a reflection type liquid crystal display device. On the other hand, in the case of forming a transmission type liquid crystal display device, it is sufficient if a pixel electrode provided for each pixel of a pixel portion is formed of a transparent electrode. In this example, a method of fabricating an active matrix substrate corresponding to the transmission type liquid crystal display device will be described with reference to FIGS. 16A and 16B.

Figure 16A:
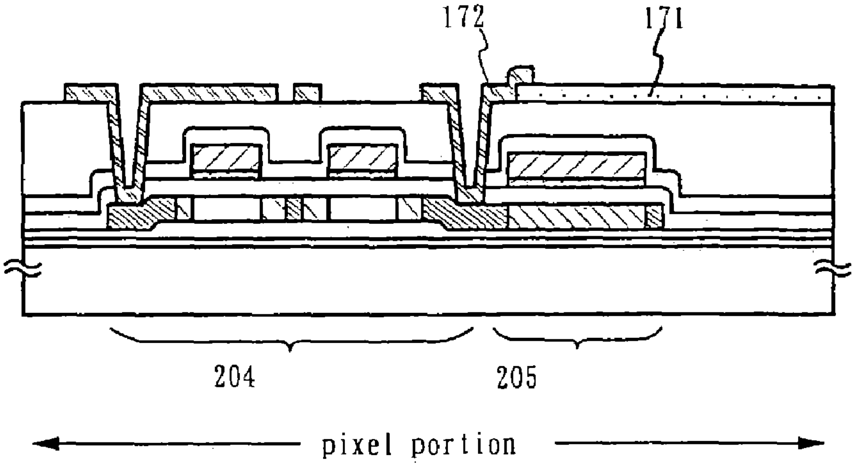
FIGS. 16A and 16B are sectional views sowing a structure of a pixel TFT.
Figure 16B:
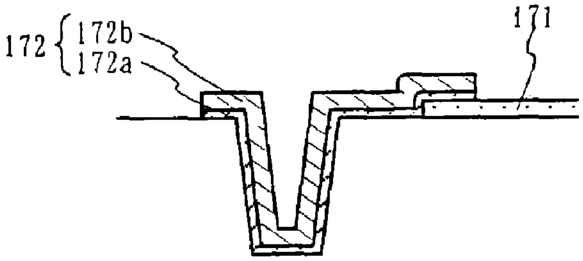

The active matrix substrate is fabricated similarly to the example 1. FIG. 16A shows a structure of a pixel portion thereof. FIG. 16A shows an example in which a transparent conductive film is first formed on a second interlayer insulating film, a patterning process and an etching process are carried out to form a pixel electrode 171, and then, a drain wiring line 172 is formed to partially overlap with the pixel electrode 171. As shown in FIG. 16B, a Ti film 172*a* is formed to a thickness of 50 to 150 nm, a semiconductor film for forming a source or drain region of an island-like semiconductor layer and a contact are formed, and an Al film 172*b* having a thickness of 300 to 400 nm is formed on the Ti film 172*a*. When this structure is adopted, the pixel electrode 171 is in contact with only the Ti film 172*a* forming the drain wiring line 172. As a result, it is possible to certainly prevent the transparent conductive material from directly coming in contact with and reacting with Al.

As a material of the transparent conductive film, it is possible to use indium oxide ($In_2O_3$), indium oxide—tin oxide alloy ($In_2O_3$—$SnO_2$; ITO), or the like, which is formed by a sputtering method or vacuum evaporation method. An etching process of such material is carried out by a hydrochloric acid base solution. However, etching of ITO is especially liable to generate the residue, and in order to improve the etching workability, indium oxide-zinc oxide alloy ($In_2O_3$—ZnO) may be used. The indium oxide—zinc oxide alloy has features that it is excellent in surface flatness and is also excellent in heat stability as compared with ITO. Similarly, zinc oxide (ZnO) is also a suitable material, and further, in order to raise transmissivity of visible light and conductivity, zinc oxide (ZnO:Ga) added with gallium (Ga), or the like can be used.

The structure of the driving circuit may be the same as the example 1, and in this way, the active matrix substrate corresponding to the transmission type display device can be completed.

EXAMPLE 3

In a method of fabricating an island-like semiconductor layer having a crystal structure from an island-like semiconductor layer having an amorphous structure by the dual beam laser annealing method of the present invention, a trace amount (about $1\times10^{17}$ to $1\times10^{19}/cm^3$) of catalytic element used for crystallization remains in the island-like semiconductor layer having the crystal structure fabricated by the method of the embodiment 2. Of course, although a TFT can be completed even in such a state, it is preferable to remove the remaining catalytic element from at least a channel formation region. As one of means for removing this catalytic element, there is a means using the gettering function of phosphorus (P).

Figure 17:
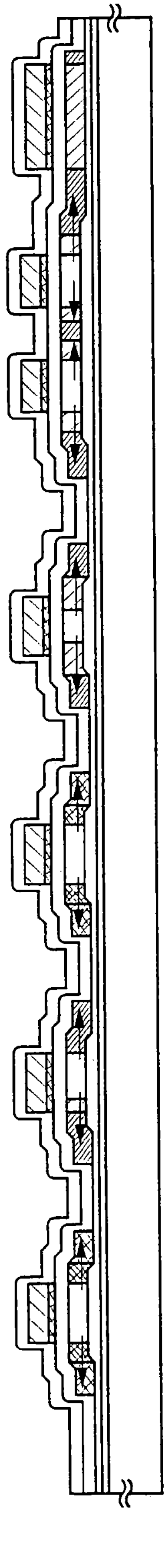
FIG. 17 is a sectional view showing a fabricating process of a pixel TFT and TFTs of a driver circuit.

A gettering process by phosphorus (P) for this object can be carried out in parallel with the activation step explained in FIG. 12A. This state will be described with reference to FIG. 17. The concentration of phosphorus (P) required for gettering may be comparable to the impurity concentration of the high concentration n-type impurity region, and by the thermal annealing of the activation step, the catalytic element can be made to segregate from the channel formation regions of the n-channel TFT and the p-channel TFT through the concentration into the impurity regions containing phosphorus (P) (directions of arrows shown in FIG. 17). As a result, the catalytic element segregates in the impurity region, and the concentration becomes about $1\times10^{17}$ to $1\times10^{19}$ atoms/cm$^3$. In the TFT fabricated in this way, its off current value is lowered and crystallinity is excellent, so that high field effect mobility can be obtained and excellent characteristics can be achieved.

EXAMPLE 4

Figure 18:
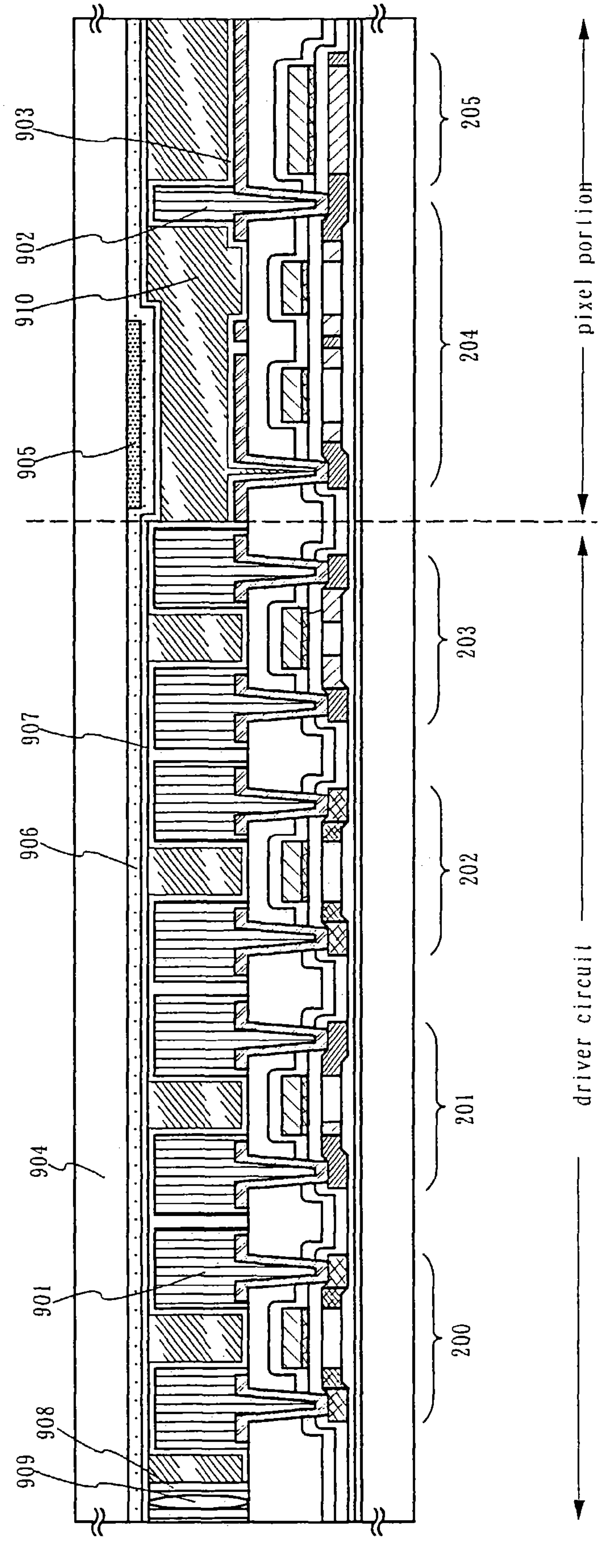
FIG. 18 is a sectional view of an active matrix type liquid crystal display device.

In this example, a process of fabricating an active matrix type liquid crystal display device from an active matrix substrate fabricated in the example 1 will be described. As shown in FIG. 18, columnar spacers 901 and 902 are formed on the active matrix substrate in the state of FIG. 12B. Although a method of dispersing particles of several μm to provide the spacers may be used, the columnar spacers may be formed like this by forming a resin film on the entire surface of the substrate and patterning this. Although the material of such columnar spacers is not restricted, for example, NN700 made by JSR Co., Ltd. is used, and after it is applied by a spinner, an exposure and a developing process are carried out to form a predetermined pattern. Further, heating at 150 to 200° C. is carried out by a clean oven or the like to harden it. Although the shape of the columnar spacer fabricated in this way can be changed by conditions of the exposure and developing process, if the shape of each of the columnar spacers 901 and 902 is preferably made such that it is columnar and its top is flat, it is suitable in securing the mechanical strength as a liquid crystal display panel when an opposite side substrate is fitted. Although the shape of the columnar spacer may be cylindrical or prismatic and is not particularly limited, for example, when it is cylindrical, concretely, the height H is made 1.2 to 5 μm, the average radius L1 is made 5 to 7 μm, and the ratio of the average radius L1 to the radius L2 of the bottom portion is made 1:1.5. At this time, a taper angle of a side is made ±15° or less.

Although the arrangement of the columnar spacers may be arbitrarily determined, preferably, as shown in FIG. 18, in the pixel portion, the columnar spacer 902 is formed to overlap with the contact portion 235 of the drain wiring line 166 (pixel electrode) to cover the portion. Since the flatness of the contact portion 235 is damaged and liquid crystal comes not to be oriented well in this portion, when the columnar spacer 902 is formed in the form of filling the contact portion 235 with the resin for the spacer in this way, disclination or the like can be prevented.

Thereafter, an oriented film 903 is formed. Normally, polyimide resin is used for an oriented film of a liquid crystal display device. After the oriented film is formed, a rubbing treatment is carried out so that liquid crystal molecules are oriented with a certain constant pretilt angle. The rubbing treatment is carried out so that a region which is not subjected to rubbing in the rubbing direction from the end portion of the columnar spacer 902 provided in the pixel portion becomes 2 μm or less. Although generation of static electricity often becomes a problem in the rubbing treatment, when the columnar spacer 901 is formed on the TFT of the driving circuit and to cover the source wiring line and the drain wiring line, the original role of the spacer and the effect to protect the TFT from the static electricity in the rubbing step can be obtained. In FIG. 18, although the columnar spacers 901 are dividedly formed on the source wiring line and the drain wiring line on the TFT of the driving circuit, in addition, they may be formed to cover the entire surface of the driving circuit.

A light shielding film 905, a transparent conductive film 906, and an oriented film 907 are formed on an opposite substrate 904 at the opposite side. The light shielding film 905 is formed of Ti, Cr, Al or the like to a thickness of 150 to 300 nm. The active matrix substrate in which the pixel portion and the driving circuit are formed is bonded to the opposite substrate through a sealing agent 908. A filler 909 is mixed in the sealing agent 908, and the two substrates are bonded while a uniform interval is kept by the filler 909 and the columnar spacers 901 and 902. Thereafter, a liquid crystal material 910 is injected between both the substrate, and complete sealing is made by a sealing agent (not shown). As the liquid crystal material, a well-known liquid crystal material may be used. For example, in addition to a TN liquid crystal, it is also possible to use a thresholdless antiferroelectric mixed liquid crystal showing electro-optical response properties in which transmissivity is continuously changed to an electric field. Some thresholdless antiferroelectric mixed liquid crystal shows V-shaped electro-optical response characteristics. In this way, the active matrix type liquid crystal display device shown in FIG. 18 is completed.

Figure 19:
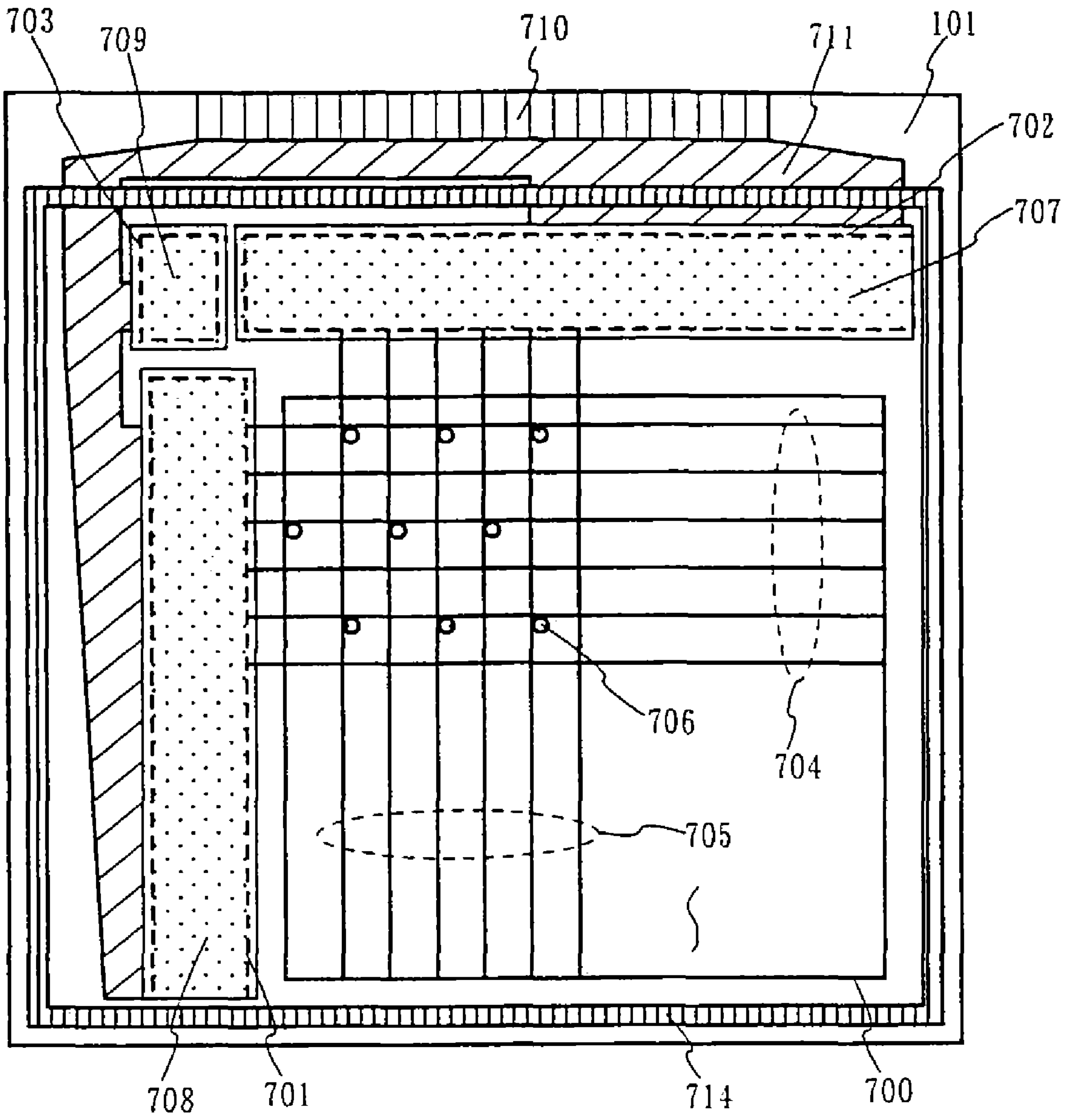
FIG. 19 is a top view for explaining an input/output terminal, a wiring line, a circuit arrangement, a spacer, and an arrangement of a sealing agent in a liquid crystal display device.

FIG. 19 is a top view of an active matrix substrate, which shows the positional relation of a pixel portion, a driving circuit portion, a spacer and a sealing agent. A scan signal driving circuit 701 and an image signal driving circuit 702 are provided as driving circuits at the periphery of a pixel portion 700. Further, a signal processing circuit 703 such as a CPU or memory may be added. These driving circuits are connected to an external input/output terminal 710 through a connection wiring line 711. In the pixel portion 700, a gate wiring line group 704 extending from the scan signal driving circuit 701 and a source wiring line group 705 extending from the image signal driving circuit 702 intersect with each other in matrix form to shape pixels, and a pixel TFT 204 and a holding capacitance 205 are provided in each pixel.

The columnar spacer 706 provided in the pixel portion corresponds to the columnar spacer 902 shown in FIG. 18. Although the spacer may be provided for every pixel, it may be provided every several to several tens pixels arranged in matrix form. That is, it is appropriate that the ratio of the number of spacers to the total number of pixels constituting the pixel portion is made 20 to 100%. Spacers 707, 708, and 709 provided at the driving circuit portion may be provided to cover the entire surface, or may be provided so that they are divided into plural portions in conformity with the position of the source and drain wiring line of each TFT.

A sealing agent 714 is formed outside of the pixel portion 700 on the substrate 101, the scan signal driving circuit 701, the image signal driving circuit 702, and the other signal processing circuit 703, and inside of the external input/output terminal 710.

Figure 20:
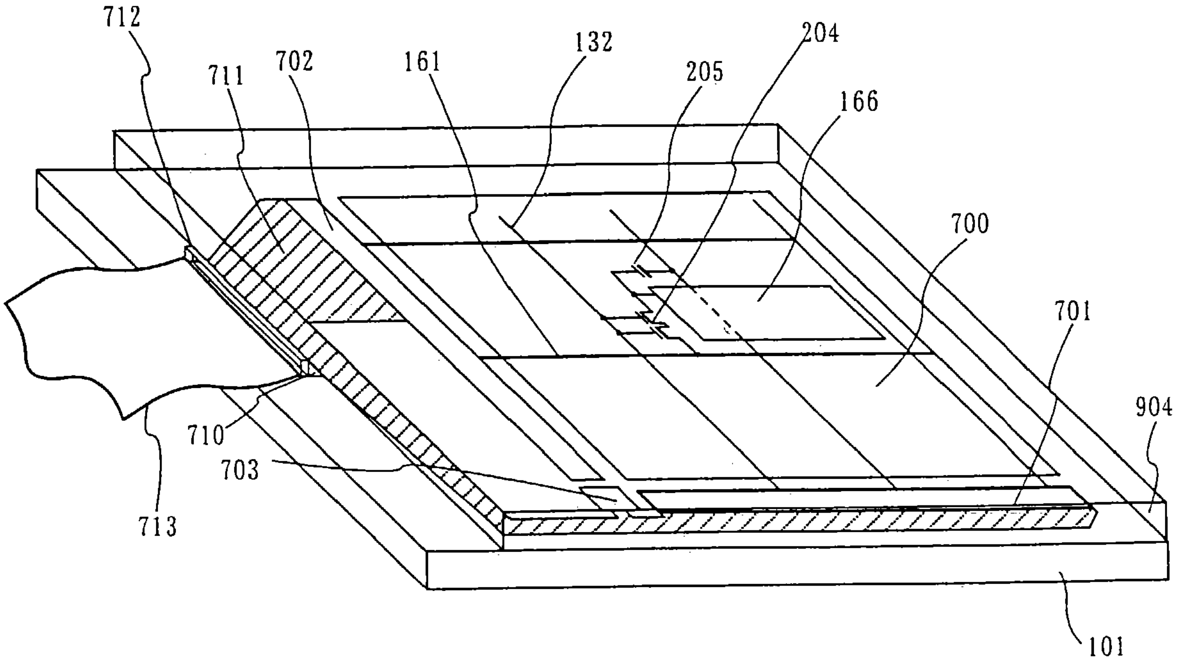
FIG. 20 is a perspective view showing a structure of a liquid crystal display device.

The structure of such an active matrix type liquid crystal display device will be described with reference to a perspective view of FIG. 20. In FIG. 20, the active matrix substrate is constituted by the pixel portion 700, the scan signal driving circuit 701, the image signal driving circuit 702, and the other signal processing circuit 703, which are formed on the glass substrate 101. In the pixel portion 700, the pixel TFT 204 and the holding capacitance 205 are provided, and the driving circuits provided at the periphery of the pixel portion are constituted with a CMOS circuit as a base. The scan signal driving circuit 701 and the image signal driving circuit 702 are connected to the pixel TFT 204 through the gate wiring line 132 and the source wiring line 161, respectively. A flexible printed circuit (FPC) 713 is connected to the external input terminal 710 and is used to input an image signal or the like. The flexible printed circuit 713 is fixed while the adhesion strength is raised by a reinforcing resin 712, and is connected to the respective driving circuits through the connection wiring line 711. Although not shown, a light shielding film and a transparent electrode are provided on an opposite substrate 175.

The liquid crystal display device of such a structure can be formed by using the active matrix substrate shown in the examples 1 to 3. For example, when the active matrix substrate shown in the example 1 is used, a reflection type liquid crystal display device can be obtained, and when the active matrix substrate shown in the example 2 is used, a transmission type liquid crystal display device can be obtained.

EXAMPLE 5

Figure 21A:
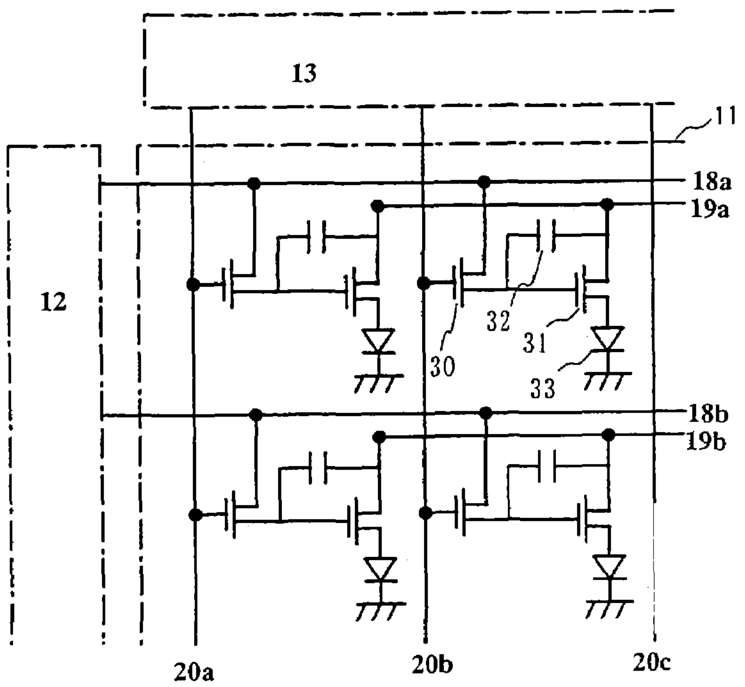
FIGS. 21A and 21B are views showing a structure of an active matrix type EL display device.

In this example, with reference to FIGS. 21A and 21B, a description will be made on an example in which the present invention is applied to a display device (organic EL display device) using an active matrix type organic electroluminescence (organic EL) material. FIG. 21A is a circuit diagram of an active matrix type organic display device in which a display region and a driving circuit at the periphery thereof are provided on a glass substrate. This organic EL display device is constituted by a display region 11, an X-direction peripheral driving circuit 12, and a Y-direction peripheral driving circuit 13, which are provided on the substrate. This display region 11 is constituted by a switching TFT 30, a holding capacitance 32, a current controlling TFT 31, an organic EL element 33, X-direction signal lines 18*a* and 18*b*, power source lines 19*a* and 19*b*, and Y-direction signal lines 20*a*, 20*b* and 20*c*, and the like.

Figure 21B:
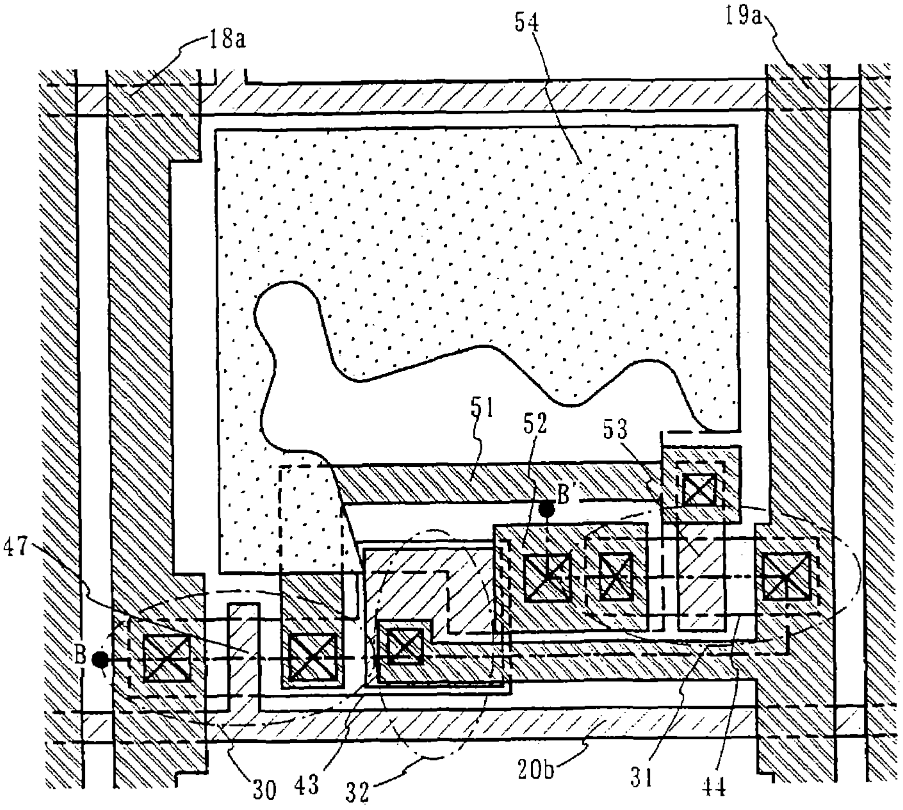

FIG. 21B is a top view showing substantially one pixel. It is appropriate that the switching TFT 30 is formed in the same way as the n-channel TFT 204 shown in FIG. 10C, and the current controlling TFT 31 is formed in the same way as the n-channel TFT 201.

Figure 22:
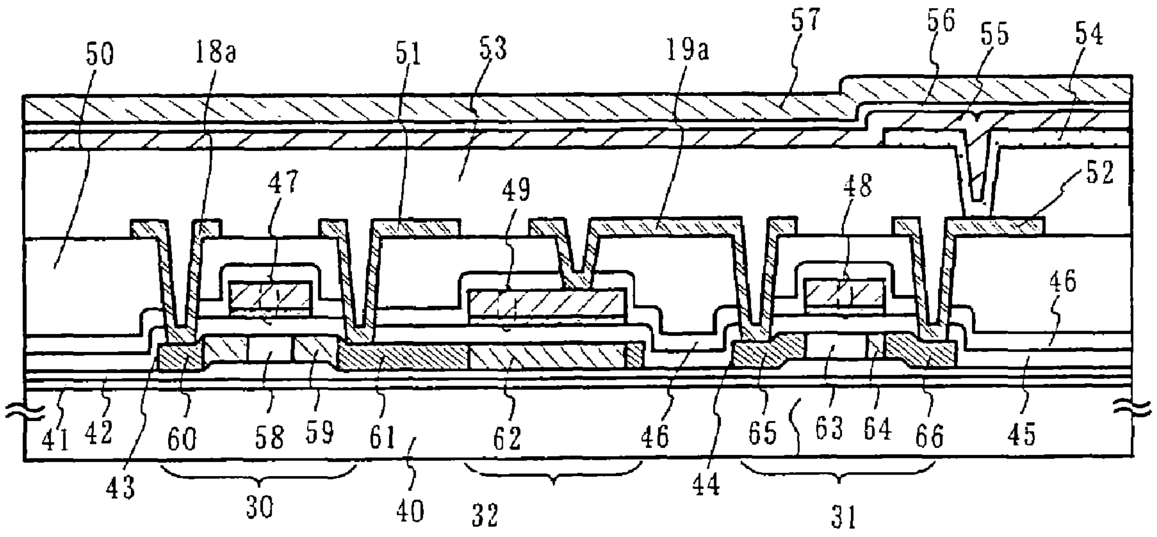
FIG. 22 is a sectional view showing a structure of a pixel portion of an active matrix type EL display device.

FIG. 22 is a sectional view taken along line B-B' of FIG. 21B, which shows the switching TFT 30, the holding capacitance 32, the current controlling TFT 31, and an organic EL element portion. In FIG. 22, island-like semiconductor layers 43 and 44 are fabricated by the method of the embodiments 1 to 4. Then, base films 41 and 42, a gate insulating film 45, a first interlayer insulating film 46, gate electrodes 47 and 48, a capacitance wiring line 49, source and drain wiring lines 18*a*, 19*a*, 51, 52, and a second interlayer insulating film 50 are fabricated on a substrate 40 in the same way as the example 1. Then, similarly to the second interlayer insulating film 50, a third interlayer insulating film 53 is formed thereon, and after a contact hole reaching the drain wiring line 52 is formed, a pixel electrode 54 made of a transparent conductive film is formed. The organic EL element portion is formed of the pixel electrode 54, an organic EL layer 55 formed over the pixel electrode and the third interlayer insulating film 53, a first electrode 56 formed on the organic EL layer and made of MgAg compound, and a second electrode 57 made of Al. Although not shown, if a color filter is provided, color displaying can also be made. In any event, if the method of fabricating the active matrix substrate shown in the examples 1 to 5 is applied, the active matrix type EL display device can be easily fabricated. Such an active matrix type EL display device can be fabricated by using an active matrix substrate fabricated by freely combining the examples 1 to 3.

Embodiment 6

An active matrix substrate, a liquid crystal display device, and an EL display device fabricated by carrying out the present invention can be used for various electro-optical devices. Further, the present invention can be applied to all electronic instruments incorporating such electro-optical devices as display media. As the electronic instrument, a personal computer, a digital camera, a video camera, a portable information terminal (mobile computer, portable telephone, electronic book, etc.), a navigation system, and the like can be enumerated.

Figure 23A:
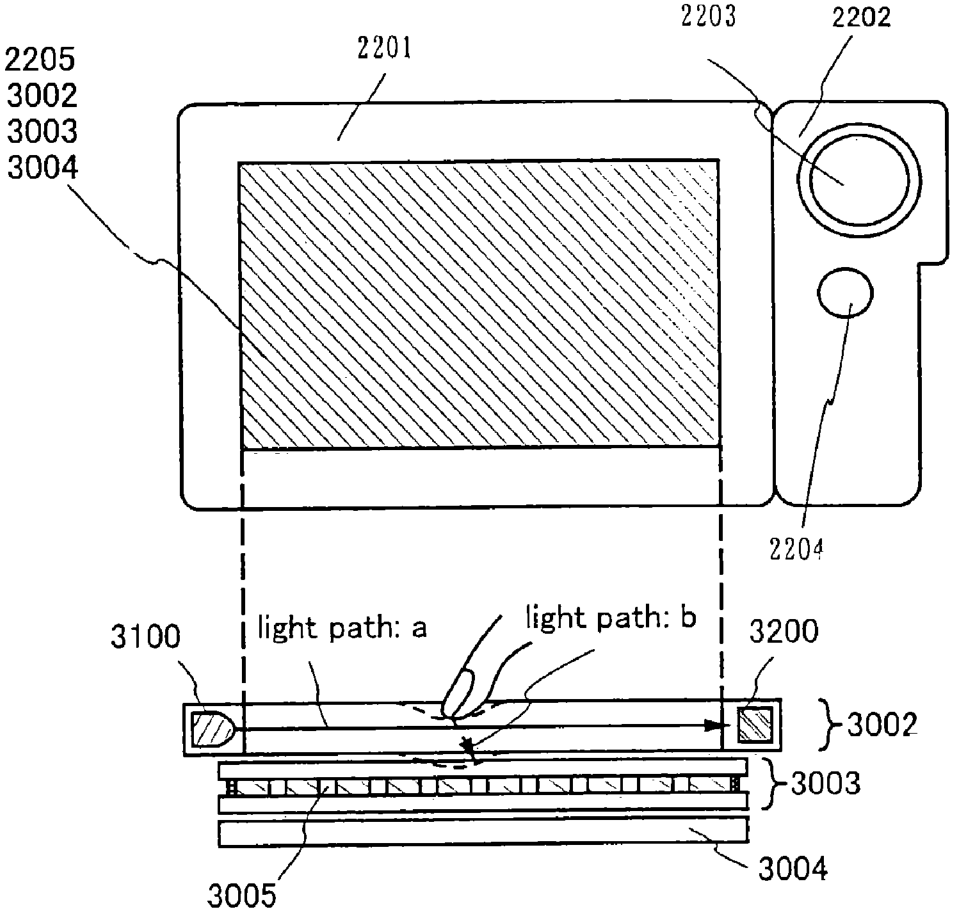
FIGS. 23A to 23B are views showing an example of a semiconductor device.

FIG. 23A shows a portable information terminal which is constituted by a main body 2201, an image input portion 2202, an image receiving portion 2203, an operation switch 2204, and a display device 2205. The present invention can be applied to the display device 2205 and other signal control circuits.

Such a portable information terminal is often used outdoors as well as indoors. In order to enable a long time use, a reflection type liquid crystal display device which does not use a backlight but uses outer light is suitable as a low power consumption type. However, in the case where the environment is dark, a transmission type liquid crystal display device provided with a backlight is suitable. From such a background, a hybrid liquid crystal display device provided with characteristics of both the reflection type and the transmission type has been developed. The present invention can also be applied to such a hybrid liquid crystal display device. The display device 2205 is constituted by a touch panel 3002, a liquid crystal display device 3003, and an LED backlight 3004. The touch panel 3002 is provided to facilitate the operation of the portable information terminal. In the structure of the touch panel 3002, a light emitting element 3100 such as an LED is provided at one end, a light receiving element 3200 such as a photodiode is provided at the other end, and an optical path is formed therebetween. When this touch panel 3002 is pressed to block the light path, the output of the light receiving element 3200 is changed. Thus, when this principle is used and the light emitting element and the light receiving element are arranged in matrix form on the liquid crystal display device, the panel can be made to function as an input medium.

Figure 23B:
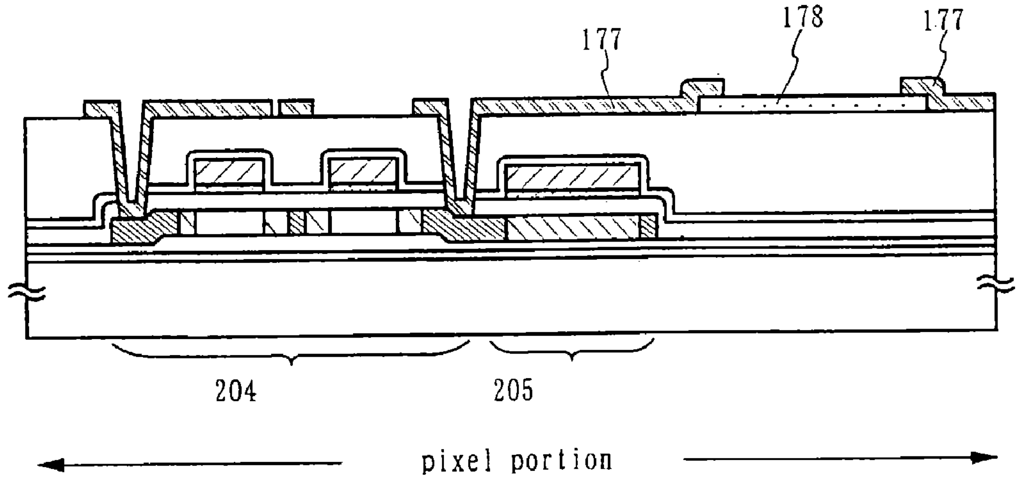

FIG. 23B shows a structure of a pixel portion of a hybrid liquid crystal display device. A drain wiring line 177 and a pixel electrode 178 are provided on an interlayer insulating film on the pixel TFT 204 and the holding capacitance 205. Such a structure can be formed by applying the example 4. The drain wiring line is made of a laminate structure of a Ti film and an Al film, and is made a structure serving also as a pixel electrode. The pixel electrode 178 is formed by using a transparent conductive film material explained in the example 4. When the liquid crystal display device 3003 is fabricated from such an active matrix substrate, it can be preferably used for a portable information terminal.

Figure 24A:
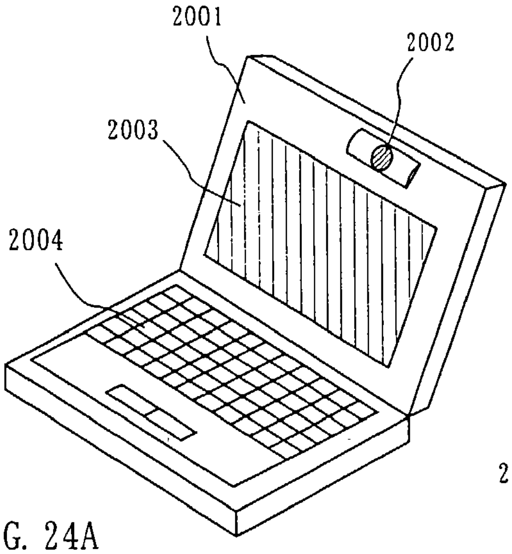
FIGS. 24A to 24F are views showing examples of semiconductor devices.

FIG. 24A shows a personal computer which is constituted by a main body 2001 provided with a microprocessor, memory and the like, an image input portion 2002, a display device 2003, and a keyboard 2004. The present invention can be applied to the display device 2003 and other signal processing circuits.

Figure 24B:
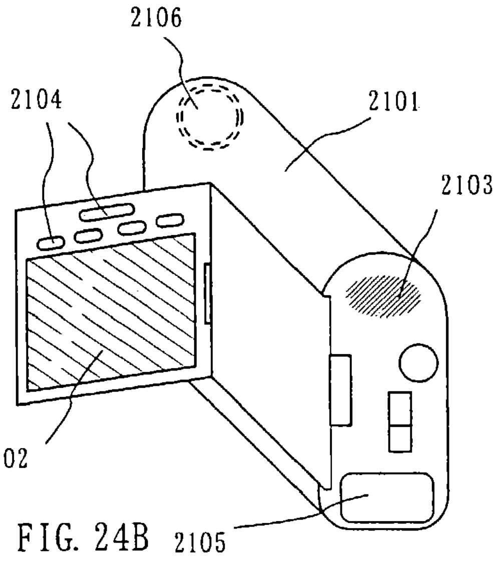

FIG. 24B shows a video camera which is constituted by a main body 2101, a display device 2102, an audio input portion 2103, an operation switch 2104, a battery 2105, and an image receiving portion 2106. The present invention can be applied to the display device 2102 and other signal control circuits.

Figure 24C:
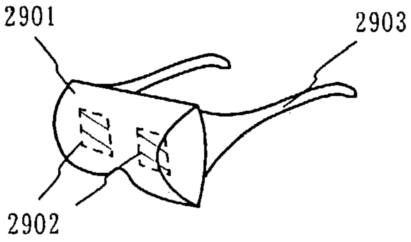

FIG. 24C shows a goggle type display which is constituted by a main body 2901, a display device 2902, and an arm portion 2903. The present invention can be applied to the display device 2902 and other not-shown signal control circuits.

Figure 24D:
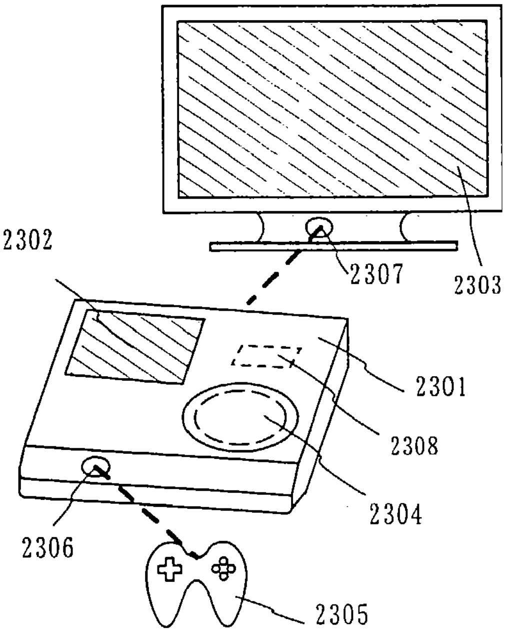

FIG. 24D shows an electronic play equipment, such as a TV game or video game, which is constituted by an electronic circuit 2308 such as a CPU, a main body 2301 mounted with a recording medium 2304 or the like, a controller 2305, a display device 2303, and a display device 2302 incorporated in the main body 2301. The display device 2303 and the display device 2302 incorporated in the main body 2301 may display the same information. Alternatively, the former is made a main display device, and the latter is made a sub display device which displays information of the recording medium 2304, displays the operation state of the equipment, or can also be made an operation plate by adding the function of a touch sensor. Besides, the main body 2301, the controller 2305, and the display device 2303 may be connected with wired communication to mutually transmit signals, or may be connected with wireless communication or optical communication by providing sensor portions 2306 and 2307. The present invention can be applied to the display devices 2302 and 2303. A conventional CRT may be used for the display device 2303.

Figure 24E:
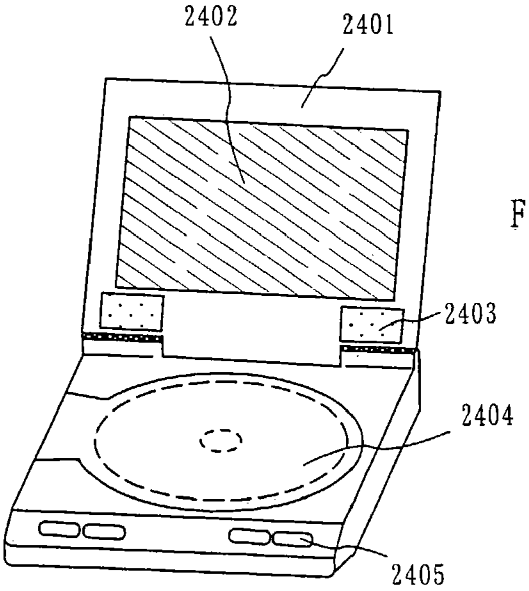

FIG. 24E shows a player using a recording medium recording a program (hereinafter referred to as a “recording medium”), which is constituted by a main body 2401, a display device 2402, a speaker portion 2403, a recording medium 2404, and an operation switch 2405. A DVD (Digital Versatile Disc), compact-disk (CD), or the like is used as the recording medium, and reproduction of a music program, picture display, information display through a video game (or TV game) or the Internet can be performed. The present invention can be preferably applied to the display device 2402 and other signal control circuits.

Figure 24F:
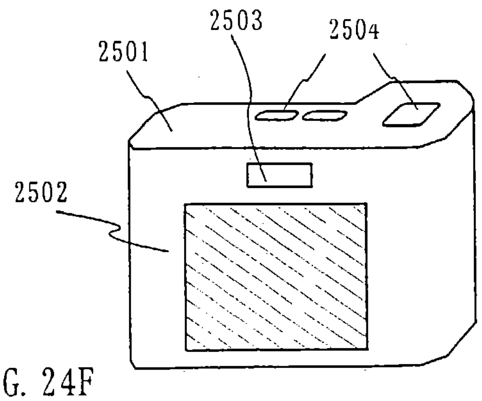

FIG. 24F shows a digital camera which is constituted by a main body 2501, a display device 2502, an eyepiece portion 2503, an operation switch 2504, and an image receiving portion (not shown). The present invention can be applied to the display device 2502 and other signal control circuits.

Figure 25A:
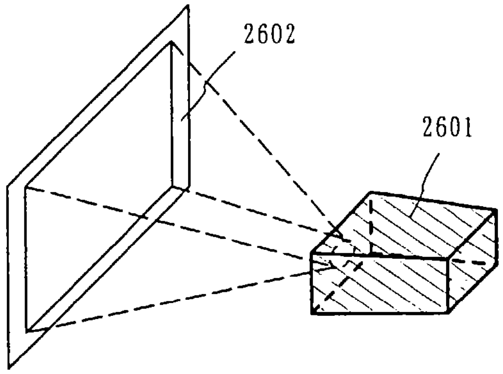
FIGS. 25A to 25D are views showing structures of projection type liquid crystal display devices.

FIG. 25A shows a front type projector which is constituted by an optical source system and display device 2601 and a screen 2602. The present invention can be applied to the display device and other signal control circuits.

Figure 25B:
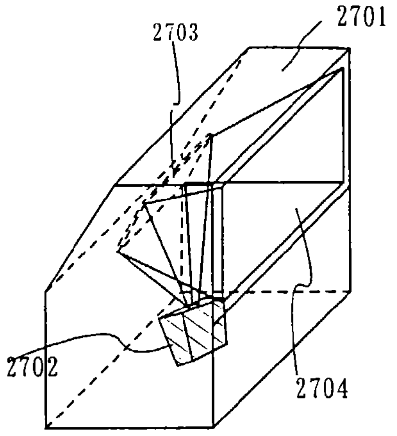

FIG. 25B shows a rear type projector which is constituted by a main body 2701, an optical source system and display device 2702, a mirror 2703, and a screen 2704. The present invention can be applied to the display device and other signal control circuits.

Figure 25C:
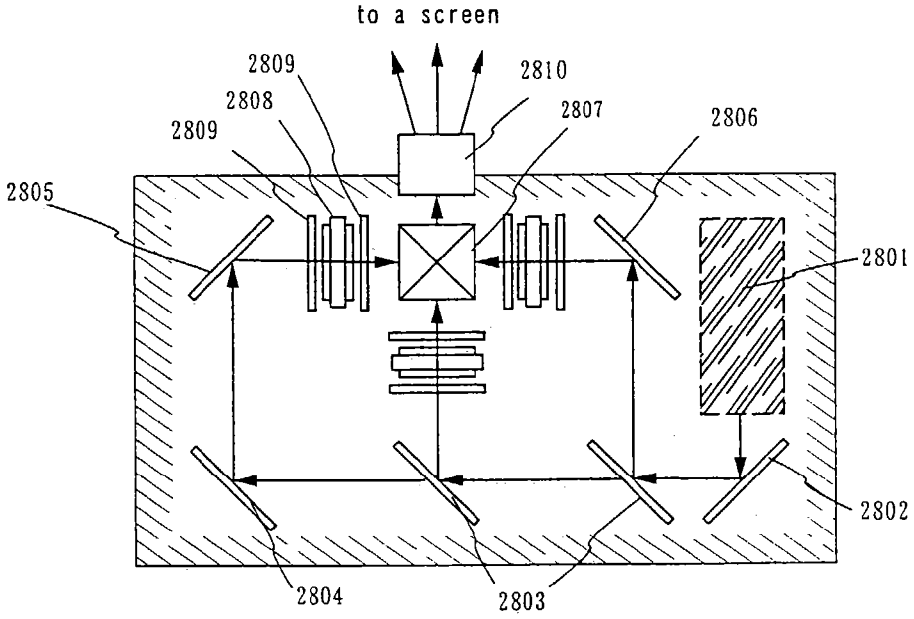

FIG. 25C is a view showing an example of the structures of the light source optical system and display devices 2601 and 2701 in FIG. 25A and FIG. 25B. Each of the light source optical system and display devices 2601 and 2702 is constituted by a light source optical system 2801, mirrors 2802, and 2804 to 2806, a dichroic mirror 2803, a beam splitter 2807, a liquid crystal display device 2808, a phase difference plate 2809, and a projection optical system 2810. The projection optical system 2810 is constituted by a plurality of optical lenses. Although FIG. 25C shows an example of a three-plate system in which three liquid crystal display devices 2808 are used, the invention is not limited to this system, but a single plate optical system may be adopted. Besides, in light paths indicated by arrows in FIG. 25C, an optical lens, a film having a polarizing function, a film for adjusting a phase, an IR film or the like may be suitably provided.

Figure 25D:
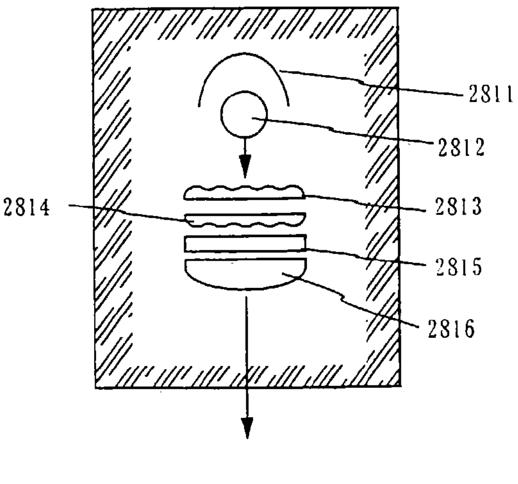

FIG. 25D is a view showing an example of the structure of the light source optical system 2801 in FIG. 25C. In this example, the light source optical system 2801 is constituted by a reflector 2811, a light source 2812, lens arrays 2813 and 2814, a polarization conversion element 2815, and a condensing lens 2816. Incidentally, the light source optical system shown in FIG. 25D is merely an example, and the invention is not limited to the structure shown in the drawing.

Besides, although not shown here, the present invention can also be applied to a navigation system, a readout circuit of an image sensor, and so on. Like this, the scope of application of the present invention is very wide, and the invention can be applied to electronic instruments of any fields. Besides, the electronic instruments of this example can be realized by using the technique of the examples 1 to 5.

As described above, the crystalline semiconductor film of the present invention is obtained by the laser annealing method in which a pulsed oscillation type or continuous-wave excimer laser or argon laser is used as a light source, and a linearly formed laser beam through an optical system is irradiated to an island-like semiconductor layer from both the front side and the reverse side of a substrate on which the island-like semiconductor layer is formed. A laser apparatus used in such a laser annealing method does not require a complicated structure, but a mirror has only to be provided at the reverse side of the substrate. Thus, it can easily meet the increase of the size of a processed substrate as well.

Then, as described above, a crystalline semiconductor film in which the position and size of a crystal grain is controlled can be obtained. Besides, by using such a crystalline semiconductor film for a channel formation region of a TFT, it is possible to realize the TFT capable of operating at high speed. Further, the invention can provide a technique by which such a TFT can be applied to various semiconductor devices such as a transmission type liquid crystal display device or a display device using an organic electroluminescence material.

What is claimed is:

1. A semiconductor device comprising:
- a light-transmitting substrate;
- a base film having first and second projections, the film being formed over one surface of the light-transmitting substrate;
- a first island-like semiconductor layer having a crystal structure entirely covering the first projection and extending over a pair of edges of the first projection;
- a gate insulating film over the first island-like semiconductor layer;
- a gate electrode over the gate insulating film;
- a second island like semiconductor layer having a first portion covering the second projection and a second portion not covering the second projection; and
- a capacitor comprising the second portion.

2. A semiconductor device according to claim 1, wherein a height of the projection is 30 to 100 nm.

3. A semiconductor device according to claim 1, wherein the base film comprises a silicon oxide film, a silicon nitride film or a silicon nitride oxide film.

4. A semiconductor device according to claim 1, wherein the semiconductor device is applied to an electronic instrument selected from the group consisting of a personal computer, a video camera, a goggle type display, an electronic play equipment, a player using a recording medium, a digital camera, a front type projector and a rear type projector.

5. A semiconductor device comprising:
- a light-transmitting substrate;
- a base film having first and second projections is provided over one surface of the light-transmitting substrate;
- a first thin film transistor comprising:
  - a first island-like semiconductor layer comprising a channel formation region, wherein at least a part of the channel formation region is provided over the first projection, and wherein the island-like semiconductor layer entirely covers the first projection and extends over a pair of edges of the projection;
  - a gate insulating film over the first island-like semiconductor layer; and
  - a gate electrode over the gate insulating film;
- a second thin film transistor comprising:
  - a first portion of a second island like semiconductor layer covering the second projection; and
  - a capacitor comprising a second portion of the second island like semiconductor layer not covering the second projection.

6. A semiconductor device according to claim 5, wherein a height of the projection is 30 to 100 nm.

7. A semiconductor device according to claim 5, wherein the base film comprises a silicon oxide film, a silicon nitride film or a silicon nitride oxide film.

8. A semiconductor device according to claim 5, wherein the semiconductor device is applied to an electronic instrument selected from the group consisting of a personal computer, a video camera, a goggle type display, an electronic play equipment, a player using a recording medium, a digital camera, a front type projector and a rear type projector.

9. A semiconductor device comprising:
- a light-transmitting substrate;
- a base film having first and second regions of a first thickness and a third region of a second thickness, over one surface of the light-transmitting substrate, wherein the second thickness is smaller than the first thickness, and wherein an area of each of the first and second regions of the first thickness is smaller than an area of the third region of the second thickness;
- a first island-like semiconductor layer having a crystal structure over the first region of the first thickness and the third region of the second thickness,
- a first gate insulating film over the first island-like semiconductor layer; and
- a first gate electrode over the first gate insulating film,
- wherein the first island-like semiconductor layer entirely covers the first region of the first thickness,
- a second island like semiconductor layer having a first portion over the second region of the first thickness and a second portion over the third region of the second thickness; and
- a capacitor comprising the second portion.

10. A semiconductor device according to claim 9, wherein a difference in film thickness between the region of the first thickness and the region of the second thickness is 30 to 100 nm.

11. A semiconductor device according to claim 9, wherein the base film comprises a silicon oxide film, a silicon nitride film or a silicon nitride oxide film.

12. A semiconductor device according to claim 9, wherein the semiconductor device is applied to an electronic instrument selected from the group consisting of a personal computer, a video camera, a goggle type display, an electronic play equipment, a player using a recording medium, a digital camera, a front type projector and a rear type projector.

13. A semiconductor device comprising:
- a light-transmitting substrate;
- a base film having first and second regions of a first thickness and a third region of a second thickness, over one surface of the light-transmitting substrate, wherein the second thickness is smaller than the first thickness, and wherein an area of each of the first and second regions of the first thickness is smaller than an area of the third region of the second thickness;

a first thin film transistor comprising:

a channel formation region, wherein at least a part of the channel formation region is provided over the first region of the first thickness;

source and drain regions, wherein at least a part of the source and drain regions is provided over the third region of the second thickness, wherein the channel formation region and the source and drain regions entirely cover the region of the first thickness;

a gate insulating film over the channel formation region, and the source and drain regions; and a gate electrode over the gate insulating film, a second thin film transistor comprising:

a first portion of a second island like semiconductor layer over the second region of the first thickness; and a capacitor comprising a second portion of the second island like semiconductor layer over the third region of the second thickness.

14. A semiconductor device according to claim 13, wherein a difference in film thickness between the region of the first thickness and the region of the second thickness is 30 to 100 nm.

15. A semiconductor device according to claim 13, wherein the base film comprises a silicon oxide film, a silicon nitride film or a silicon nitride oxide film.

16. A semiconductor device according to claim 13, wherein the semiconductor device is applied to an electronic instrument selected from the group consisting of a personal computer, a video camera, a goggle type display, an electronic play equipment, a player using a recording medium, a digital camera, a front type projector and a rear type projector.

* * * * *